United States Patent [19]
Collins et al.

[11] Patent Number: 5,990,017
[45] Date of Patent: Nov. 23, 1999

[54] PLASMA REACTOR WITH HEATED SOURCE OF A POLYMER-HARDENING PRECURSOR MATERIAL

[75] Inventors: Kenneth Collins, San Jose; Michael Rice, Pleasanton; David Groechel, Sunnyvale; Gerald Yin, Cupertino; Jon Mohn, Saratoga; Craig Roderick, San Jose; Douglas Buchberger, Tracy; Chan-Lon Yang, Los Gatos; Jerry Wong, Fremont; Jeffrey Marks, San Jose; Peter Keswick, Fremont, all of Calif.

[73] Assignee: Applied Materials, Inc., Santa Clara, Calif.

[21] Appl. No.: 09/104,550

[22] Filed: Jun. 25, 1998

Related U.S. Application Data

[63] Continuation of application No. 08/734,797, Oct. 23, 1996, which is a continuation-in-part of application No. 08/648,256, May 13, 1996, which is a continuation-in-part of application No. 08/580,026, Dec. 20, 1995, application No. 08/503,467, Jul. 18, 1995, Pat. No. 5,770,099, and application No. 08/597,577, Feb. 2, 1996, which is a continuation-in-part of application No. 08/521,668, Aug. 31, 1995, abandoned, which is a continuation-in-part of application No. 08/289,336, Aug. 11, 1994, abandoned, which is a continuation of application No. 07/984,045, Dec. 1, 1992, abandoned, said application No. 08/580,026, is a continuation of application No. 08/041,796, Apr. 1, 1993, Pat. No. 5,556,501, which is a continuation of application No. 07/722,340, Jun. 27, 1991, abandoned, said application No. 08/503,467, is a division of application No. 08/138,060, Oct. 15, 1993, Pat. No. 5,477,975.

[51] Int. Cl.$^6$ ................................................. H01L 21/00
[52] U.S. Cl. ............................ 438/714; 216/67; 216/68; 438/723
[58] Field of Search ..................... 438/714, 715, 438/723, 738, 743; 156/345 C, 345 PT, 345 PH; 216/67, 68

[56] References Cited

U.S. PATENT DOCUMENTS

| | | |
|---|---|---|
| 4,123,316 | 10/1978 | Tsuchimoto . |
| 4,261,762 | 4/1981 | King . |
| 4,350,578 | 9/1982 | Frieser et al. . |
| 4,427,516 | 1/1984 | Levinstein et al. . |
| 4,427,762 | 1/1984 | Takahashi et al. . |
| 4,430,547 | 2/1984 | Yoneda et al. . |
| 4,457,359 | 7/1984 | Holden . |

(List continued on next page.)

FOREIGN PATENT DOCUMENTS

| | | |
|---|---|---|
| 0 403 418 A2 | 12/1990 | European Pat. Off. . |
| 0 413 282 A2 | 2/1991 | European Pat. Off. . |
| 0 520 519 A1 | 12/1992 | European Pat. Off. . |
| 0 552 490 A1 | 7/1993 | European Pat. Off. . |

(List continued on next page.)

OTHER PUBLICATIONS

Coburn, W.J., "Increasing the Etch Rate Ratio oSiO2/Si in Fluorocarbon Plasma Etching," *IBM Technical Disclosure*, vol. 19, No. 10, Mar. 1977.

Matsuo, Seitaro, "Selective Etching of SiO2 Relative to Si by Plasma Reactive Sputter Etching," *J. Vac. Sc. Technology*, vol. 17, No. 2, Mar.–Apr. 1980.

(List continued on next page.)

*Primary Examiner*—William Powell
*Attorney, Agent, or Firm*—Michaelson and Wallace

[57] ABSTRACT

A general method of the invention is to provide a polymer-hardening precursor piece (such as silicon, carbon, silicon carbide or silicon nitride, but preferably silicon) within the reactor chamber during an etch process with a fluoro-carbon or fluoro-hydrocarbon gas, and to heat the polymer-hardening precursor piece above the polymerization temperature sufficiently to achieve a desired increase in oxide-to-silicon etch selectivity. Generally, this polymer-hardening precursor or silicon piece may be an integral part of the reactor chamber walls and/or ceiling or a separate, expendable and quickly removable piece, and the heating/cooling apparatus may be of any suitable type including apparatus which conductively or remotely heats the silicon piece.

27 Claims, 22 Drawing Sheets

U.S. PATENT DOCUMENTS

| | | |
|---|---|---|
| 4,512,391 | 4/1985 | Harra . |
| 4,565,601 | 1/1986 | Kakehi et al. . |
| 4,711,698 | 12/1987 | Douglas . |
| 4,756,810 | 7/1988 | Lamont, Jr. et al. . |
| 4,786,352 | 11/1988 | Benzing . |
| 4,786,359 | 11/1988 | Stark et al. . |
| 4,793,897 | 12/1988 | Dunfield et al. . |
| 4,807,016 | 2/1989 | Douglas . |
| 4,810,935 | 3/1989 | Boswell . |
| 4,842,683 | 6/1989 | Cheng et al. . |
| 4,870,245 | 9/1989 | Price et al. . |
| 4,918,031 | 4/1990 | Flamm et al. . |
| 4,948,458 | 8/1990 | Ogle . |
| 4,990,229 | 2/1991 | Campbell et al. . |
| 5,000,113 | 3/1991 | Wang et al. . |
| 5,006,220 | 4/1991 | Hijikata et al. . |
| 5,015,330 | 5/1991 | Okumura et al. . |
| 5,074,456 | 12/1991 | Degner et al. . |
| 5,085,727 | 2/1992 | Steger . |
| 5,169,487 | 12/1992 | Langley et al. . |
| 5,187,454 | 2/1993 | Collins et al. . |
| 5,203,956 | 4/1993 | Hansen . |
| 5,241,245 | 8/1993 | Barnes et al. . |
| 5,249,251 | 9/1993 | Egalon et al. . |
| 5,258,824 | 11/1993 | Carlson et al. . |
| 5,276,693 | 1/1994 | Long et al. . |
| 5,277,751 | 1/1994 | Ogle . |
| 5,326,404 | 7/1994 | Sato . |
| 5,346,578 | 9/1994 | Benzing et al. . |
| 5,349,313 | 9/1994 | Collins et al. . |
| 5,356,515 | 10/1994 | Tahara et al. ............................ 438/715 |
| 5,392,018 | 2/1995 | Collins et al. . |
| 5,399,237 | 3/1995 | Keswick et al. . |
| 5,401,350 | 3/1995 | Patrick et al. . |
| 5,414,246 | 5/1995 | Shapona . |
| 5,423,945 | 6/1995 | Marks et al. . |
| 5,477,975 | 12/1995 | Rice et al. . |
| 5,514,246 | 5/1996 | Blalock . |
| 5,529,657 | 6/1996 | Ishii . |
| 5,556,501 | 9/1996 | Collins et al. . |
| 5,567,268 | 10/1996 | Kadomura ........................... 156/345 C |

FOREIGN PATENT DOCUMENTS

| | | |
|---|---|---|
| 0 552 491 A1 | 7/1993 | European Pat. Off. . |
| 0 601 468 A1 | 6/1994 | European Pat. Off. . |
| 0 651 434 A2 | 5/1995 | European Pat. Off. . |
| 0 680 072 A2 | 11/1995 | European Pat. Off. . |
| 0 727 807 A1 | 8/1996 | European Pat. Off. . |
| 0 742 577 A2 | 11/1996 | European Pat. Off. . |
| 55-154582 | 12/1980 | Japan . |
| 57-155732 | 9/1982 | Japan . |
| 61-147531 | 12/1984 | Japan . |
| 61-91377 | 5/1986 | Japan . |
| 61-142744 | 6/1986 | Japan . |
| 62-12129 | 1/1987 | Japan . |
| 62-254428 | 11/1987 | Japan . |
| 63-9120 | 1/1988 | Japan . |
| WO 92/20833 | 11/1992 | WIPO . |

OTHER PUBLICATIONS

Patent Abstracts of Japan, Publication No. 07288196 A, Oct. 31, 1995 (Tokyo Electron Ltd).

Patent Abstracts of Japan, Publication No. 08017799 A, Jan. 19, 1996 (Plasma Syst: KK).

Patent Abstracts of Japan, Publication No. 62052714 A, Mar. 7, 1987 (Olympus Optical Co. Ltd; Toagosei Chem Ind Co Ltd).

PLASMA REACTOR WITH HEATED SOURCE OF A POLYMER-HARDENING PRECURSOR MATERIAL

CROSS-REFERENCE TO RELATED APPLICATIONS

This application is a continuation under 37 C.F.R. § 1.53 (b) of Ser. No. 08/734,797 filed Oct. 23, 1996, which is hereby incorporated by reference, and which is a continuation-in-part of U.S. Ser. No. 08/648,256 filed May 13, 1996 by Kenneth S. Collins et al., which is a continuation-in-part of the following co-pending U.S. applications, the disclosures of which are incorporated herein by reference:

(a) Ser. No. 08/580,026 filed Dec. 20, 1995 by Kenneth S. Collins et al. which is a continuation of Ser. No. 08/041,796 filed Apr. 1, 1993, U.S. Pat. No. 5,556,501 issued Sep. 17, 1996 which is a continuation of Ser. No. 07/722,340 filed Jun. 27, 1991 (now abandoned);

(b) Ser. No. 08/503,467 filed Jul. 18, 1995, U.S. Pat. No. 5,770,099 issued Jun. 23, 1998 by Michael Rice et al. which is a divisional of Ser. No. 08/138,060 filed Oct. 15, 1993, U.S. Pat. No. 5,477,975 issued Dec. 26, 1995; and (c) Ser. No. 08/597,577 filed Feb. 2, 1996 by Kenneth Collins, which is a continuation-in-part of Ser. No. 08/521,668 filed Aug. 31, 1995 (now abandoned), which is a continuation-in-part of Ser. No. 08/289,336 filed Aug. 11, 1994 (now abandoned), which is a continuation of Ser. No. 07/984,045 filed Dec. 1, 1992 (now abandoned). In addition, U.S. application Ser. No. 08/648,254 filed May 13, 1996 by Kenneth S. Collins et al. entitled "Inductively Coupled RF Plasma Reactor Having Overhead Solenoidal Antenna" discloses related subject matter.

BACKGROUND OF THE INVENTION

1. Technical Field

The invention is related to a plasma reactor for processing a workpiece such as a semiconductor wafer with a process employing an etch selectivity-enhancing precursor material such as polymer precursor gases.

2. Background Art

High density RF plasma reactors for etching contact openings through silicon dioxide layers to underlying polysilicon conductor layers and/or to the silicon substrate of a semiconductor wafer are disclosed in the above-referenced application by Collins et al. Ideally, such a reactor carries out an etch process which quickly etches the overlying silicon dioxide layer wherever a contact opening is to be formed, but stops wherever and as soon as the underlying polysilicon or silicon material (or other non-oxygen-containing material such as silicon nitride) is exposed, so that the process has a high oxide-to-silicon etch selectivity. Such reactors typically include a vacuum chamber, a wafer support within the chamber, process gas flow inlets to the chamber, a plasma source coil adjacent the chamber connected to an RF power source usually furnishing plasma source power and another RF power source connected to the wafer support usually to furnish plasma bias power. For a silicon oxide etch process, a process gas including an etchant such as a fluorine-containing substance is introduced into the chamber. The fluorine in the process gas freely dissociates under typical conditions so much that the etch process attacks not only the silicon oxide layer through which contact openings are to be etched, but also attacks the underlying polysilicon or silicon material as soon as it is exposed by the etch process. Thus, a typical etch process carried out by such a reactor is not the ideal process desired and has a lower oxide-to-silicon etch selectivity. As employed in this specification, the term "etch selectivity" refers to the ratio between the etch rates of two different materials, such as silicon dioxide and silicon (either crystalline silicon or polycrystalline silicon hereinafter referred to as "polysilicon"). A low etch selectivity can cause punch through. In etching shallow contact openings to intermediate polysilicon layers while simultaneously etching deep contact openings to the underlying silicon substrate, the etch process first reaches and will punch through the intermediate polysilicon layer before reaching the silicon substrate. A very high oxide-to-silicon etch selectivity is necessary to prevent the punchthrough, depending upon the ratio between the depths of the silicon substrate and the intermediate polysilicon layer through the silicon oxide. For example, if (a) the deep contact opening through the oxide to the substrate is 1.0 micron deep and is to be 50% overetched, (b) the intermediate polysilicon layer is 0.4 microns deep (below the top of the oxide layer) and (c) if not more than 0.01 microns of the intermediate polysilicon layer are to be removed (to avoid punch-through), then an oxide-to-silicon etch selectivity of at least 110:1 is required.

It is known that oxide-to-silicon etch selectivity is enhanced by a polymer film which forms more readily over silicon and polysilicon or other non-oxygen-containing layers than over silicon dioxide or other oxygen-containing layers. In order to form such a selectivity-enhancing polymer film, the fluorine-containing substance in the process gas is a fluoro-carbon or a fluoro-hydrocarbon. Some of the fluorine in the process gas is consumed in chemically etching the silicon dioxide layer on the wafer. Another portion of the fluorine reacts with other species including carbon contained in the process gas to form a polymer on the surface of the wafer. This polymer forms more rapidly and strongly on any exposed silicon and polysilicon surfaces (or other non-oxygen-containing surfaces) than on silicon dioxide (or other oxygen-containing surfaces), thus protecting the silicon and polysilicon from the etchant and enhancing etch selectivity. Etch selectivity is further improved by improving the strength of the polymer formed on polysilicon surfaces. The polymer is strengthened by increasing the proportion of carbon in the polymer relative to fluorine, which can be accomplished by decreasing the amount of free fluorine in the plasma. For this purpose, a fluorine scavenger, such as a silicon piece, can be provided in the reactor chamber and heated to avoid being covered with polymer and additionally to permit silicon ions, radicals and/or neutral species to be removed therefrom and taken into the plasma. The silicon atoms removed from the scavenger combine with some of the free fluorine in the plasma, thereby reducing the amount of fluorine available to polymerize and increasing the proportion of carbon in the polymer formed on the wafer.

While the use of a fluorine scavenger such as a heated silicon piece inside the reactor chamber enhances etch selectivity by strengthening the polymer formed on the wafer, even the etch selectivity so enhanced can be relatively inadequate for a particular application such as the simultaneous etching of contact holes of very different depths. Therefore, it would be desirable to increase the polymer strength beyond that achieved by the improved scavenging technique described above.

Another problem is that the rate of removal of silicon from the scavenger piece required to achieve a substantial increase in polymer strength is so great that the silicon piece is rapidly consumed and the consequent need for its replacement exacts a price in loss of productivity and increased cost. Typically the scavenger piece is a piece of silicon in the reactor chamber ceiling or wall or a piece of silicon near the reactor chamber ceiling. The rate of removal of silicon therefrom is enhanced by applying an RF bias potential to the silicon piece while its temperature is carefully controlled to a prevent polymer deposition thereon and to control the rate of silicon removal therefrom. As disclosed in the above-referenced U.S. application Ser. No. 08/543,067, silicon is added into the plasma by a combination of applied RF bias and heating of the scavenger piece. The temperature control apparatus is integrated with the silicon piece so that replacement of the silicon piece (e.g., a silicon ceiling) is relatively expensive. In U.S. application Ser. No. 08/597,577 referenced above, an all-silicon reactor chamber is disclosed in which the walls and ceiling are silicon, and any fluorine scavenging is done by consuming the silicon ceiling or walls, requiring their replacement at periodic intervals with a concomitant increase in cost of operation and decrease in productivity. Thus, not only is it desirable to increase the polymer strength but it is also desirable to decrease the rate at which silicon must be removed from the scavenger to achieve a desired etch selectivity.

SUMMARY OF THE INVENTION

It is a discovery of the invention that by raising the temperature of a polymer hardening precursor material such as silicon inside the reactor chamber beyond that required to merely scavenge fluorine—i.e., into a higher temperature range, a different more durable polymer is formed over exposed silicon and polysilicon surfaces which is more resistant to etching than has been possible heretofore by merely scavenging fluorine. In this respect, the term "polymer hardening precursor" refers to a material in the chamber which, when its temperature is increased, increases the resistance to etching of the polymer formed on the wafer in accordance with the temperature increase. The polymer formed by holding the polymer-hardening precursor material at the higher temperature range is more durable than polymer formed otherwise, and protects the silicon and polysilicon surfaces so much better that oxide-to-silicon etch selectivity is substantially enhanced over that attained heretofore. Material from the heated polymer-hardening precursor (e.g., silicon) piece participates favorably in the polymerization process by changing the process gas content ratios of carbon-to-fluorine, hydrogen-to-fluorine and carbon-to-hydrogen as a function of its increased temperature, so that the resulting polymer is substantially strengthened. As the polymer-hardening precursor piece in the reactor chamber is heated above the polymerization temperature (the temperature below which polymer precursor materials can condense onto the surface) and into the higher temperature range, the etch selectivity increases with the temperature increase. Thus, a general method of the invention is to provide a polymer-hardening precursor piece (such as silicon, carbon, silicon carbide or silicon nitride, but preferably silicon) within the reactor chamber during an etch process with a fluoro-carbon or fluoro-hydrocarbon gas, and to heat the polymer-hardening precursor piece above the polymerization temperature sufficiently (i.e., into the higher temperature range) to achieve a desired increase in oxide-to-silicon etch selectivity beyond that heretofore attained.

In the embodiments claimed in the present application, process uniformity across the surface of the workpiece is optimized by adjusting the radial distribution of plasma ion density in the chamber. This is accomplished by any one or some or all of the following methods of the invention. First, an overhead inductive antenna can be divided into separate radially disposed antenna sections and the RF power level in each section is changed relative to the other. Second, the radial distribution of temperature across an overhead ceiling is adjusted. Third, gas flow rate in inlets at different radial locations of the chamber are changed relative to one another.

DETAILED DESCRIPTION OF THE PREFERRED EMBODIMENTS

Figure 1:
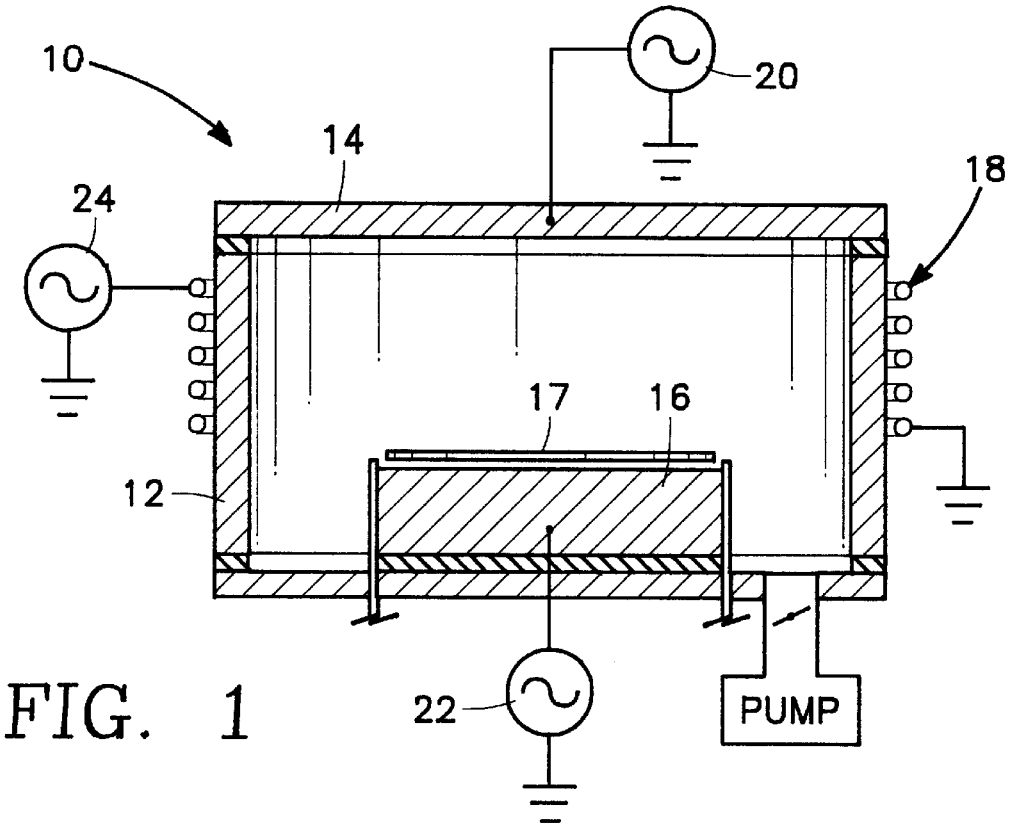
FIG. 1 is a simplified cut-away side view of a plasma reactor of the type disclosed in a first one of the co-pending applications referred to above.

Referring to FIG. 1, the above-referenced co-pending U.S. application Ser. No. 08/580,026 discloses a plasma reactor chamber 10 having a cylindrical side wall 12, a flat ceiling 14, a wafer support pedestal 16 for supporting a workpiece 17 being processed such as a semiconductor wafer, an inductive side coil 18 wound around the cylindrical side wall 12 and independent RF power sources 20, 22, 24 connected to the ceiling 14, the pedestal 16 and the inductive coil 18, respectively. In particular, the co-pending application of Collins et al. discloses that the ceiling 14 may comprise silicon in order to provide a fluorine scavenger. For this purpose, RF power is applied to the silicon ceiling 14 by the RF power source 20 to enhance the removal of silicon therefrom.

Figure 2:
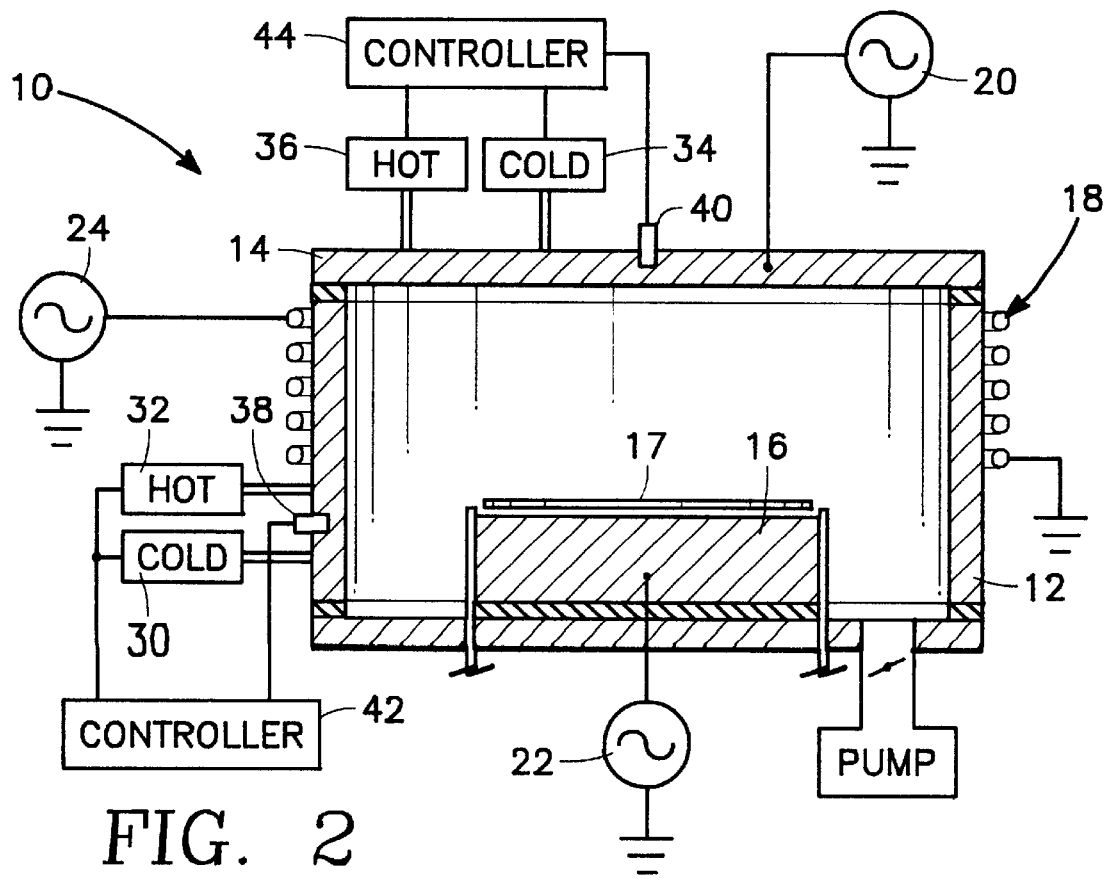
FIG. 2 is a simplified cut-away side view of a plasma reactor of the type disclosed in a second one of the co-pending applications referred to above.

Referring to FIG. 2, the above-referenced co-pending application by Rice et al. discloses that the side wall 12 is quartz and provides a temperature control system for controlling the temperature of the quartz side wall 12 and the temperature of the silicon ceiling 14. The temperature control system includes a cooling source 30 and heating source 32 coupled to the quartz side wall 12 and a cooling source 34 and heating source 36 coupled to the silicon ceiling 14. Temperature sensors 38, 40 coupled to the side wall 12 and ceiling 14, respectively, are monitored by controllers 42, 44, respectively. The controller 42 governs the cooling source 30 and heating source 32 of the quartz side wall 12 while the controller 44 governs the cooling source 34 and heating source 36 of the silicon ceiling. The purpose for controlling the temperature of the silicon ceiling 14 is, at least in part, to prevent polymer accumulation on the ceiling 14 which would otherwise prevent the ceiling 14 from donating scavenger silicon to the plasma. Therefore, controller 44 maintains the ceiling temperature somewhat above the polymer condensation (or polymerization) temperature, or about 170° C. depending upon processing conditions. At the same time, the RF power source 20 applies sufficient RF power to the silicon ceiling 14 in order promote removal of silicon from the ceiling 14 by the plasma at a sufficient rate to scavenge the desired amount of fluorine for enriching the carbon content of the polymer formed on the wafer to enhance etch selectivity. In fact, the combination of elevated temperature and applied RF bias overcomes the energy threshold below which interaction between the plasma and the ceiling 14 causes polymer deposition and above which the interaction causes etching of the ceiling 14.

Figure 3:
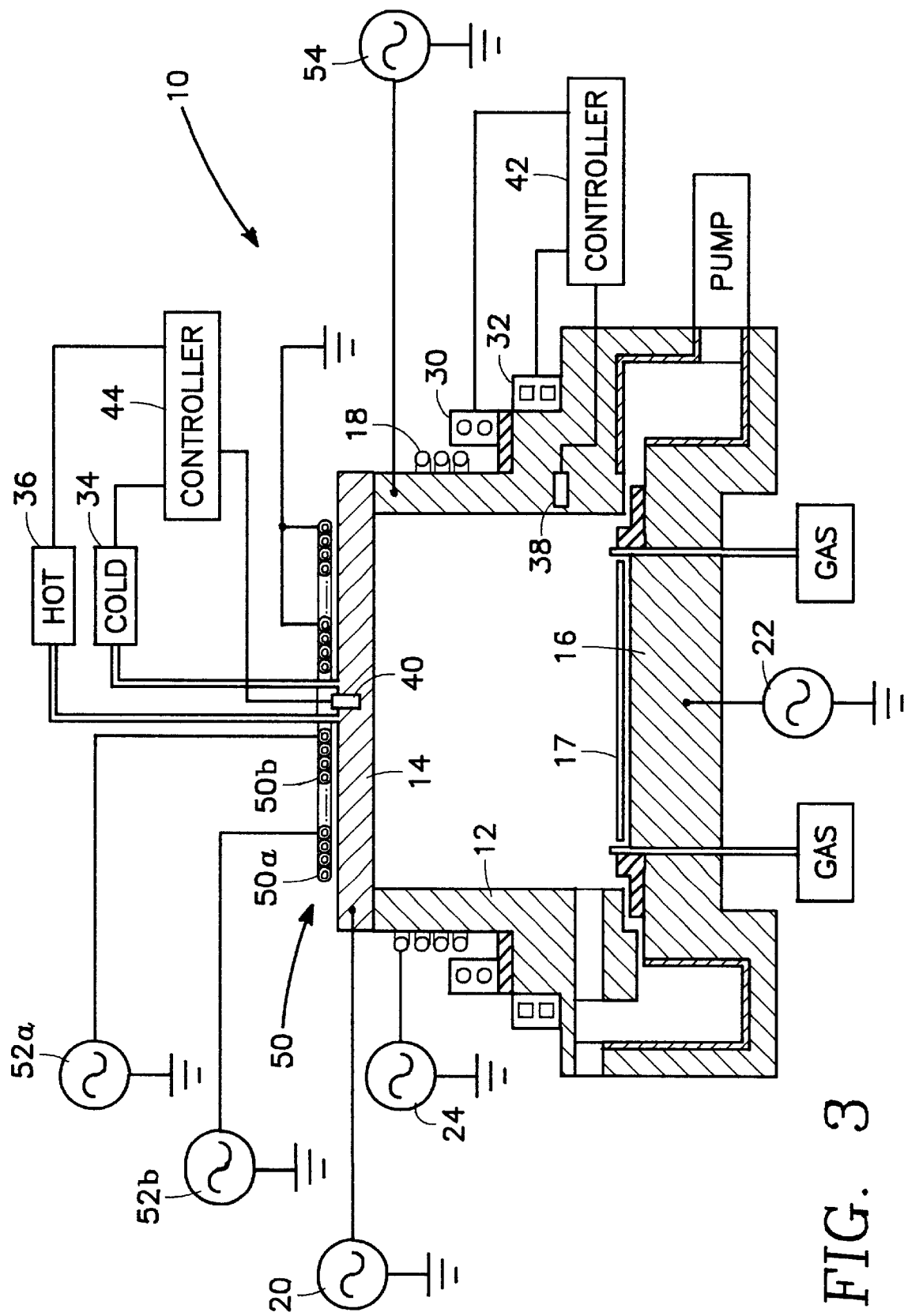
FIG. 3 is a simplified cut-away side view of a plasma reactor of the type disclosed in a third one of the co-pending applications referred to above.

Referring to FIG. 3, the above-referenced co-pending application Ser. No. 08/597,577 by Kenneth S. Collins discloses that both the ceiling 14 and the side wall 12 are a semiconductor such as silicon and that they can act as windows to permit inductive coupling of RF source power through themselves to the plasma. For this reason, either one or both the side coil 18 and an overhead inductor 50 may be employed and couple RF source power to the plasma through the silicon side wall 12 and the silicon ceiling 14. U.S. application Ser. No. 08/597,577 disclosed a planar overhead coil and such would be suitable for carrying out the present invention. However, the overhead inductor 50 of the embodiment of FIG. 3 includes inner and outer solenoids 50a, 50b (of the type disclosed in above-referenced co-pending U.S. application Ser. No. 08/648,254 filed May 13, 1996 by Kenneth S. Collins et al. entitled "Inductively Coupled RF Plasma Reactor Having Overhead Solenoidal Antenna") separately powered by independent RF power sources 52a, 52b to facilitate process uniformity control. Furthermore, both the ceiling 14 and side wall 12 can be employed as separate electrodes, so that RF power is applied to the silicon side wall 12 by a separate RF power source 54. Sufficient RF power is applied to either or both the silicon ceiling 14 and the silicon side wall 12 to promote removal of silicon therefrom for scavenging fluorine. The side wall 12 and ceiling 14 are preferably maintained above the polymer condensation temperature to permit their use as silicon scavenger precursors and to avoid the usual requirement for frequent chamber cleaning operations to remove polymer and associated contaminant deposits.

A first embodiment of the present invention is a process which does not merely enrich the carbon content of the carbon-fluorine polymer, but actually forms a different kind of polymer which more strongly adheres to the underlying silicon, polysilicon or similar non-oxygen-containing surfaces to be protected. The result is a revolutionary improvement in etch selectivity. It is a discovery of the invention that certain materials in a class including silicon, silicon carbide, graphite, silicon nitride, when raised to a higher temperature range (e.g., well above the polymer condensation temperature) become polymer-hardening precursors in which they change the chemical structure of the polymer, resulting in a polymer which is far more resistant to etching than has been provided in the prior art. The process is carried out by maintaining the temperature of a polymer-hardening precursor material inside the reactor chamber at a higher temperature range (e.g., 180° C. to 220° C. for a silicon precursor material whose potential is floating and in any case substantially above the applicable polymer condensation temperature). This higher temperature range varies greatly with the applied RF bias potential on the polymer-hardening precursor material and with the selection of the material itself.

In a second embodiment of the invention, the polymer-hardening precursor material is held in a maximum temperature range at which an even greater polymer hardness is achieved. The maximum temperature range for a silicon precursor material held at a floating potential is above 220° C. and is preferably in the range from about 300° C. to about 700° C. This maximum temperature range varies greatly with the RF bias applied to the polymer-hardening precursor material. While not necessarily subscribing to any particular theory in this specification, it is felt that, in some case but not necessarily all, at the maximum temperature range of the polymer-hardening precursor material, the polymer-hardening precursor (e.g., silicon) material removed therefrom by the plasma bonds with the fluorine, carbon and hydrogen atoms (assuming a fluoro-hydrocarbon gas is employed) as they polymerize, the material (e.g., silicon) thus added providing a different kind of polymer having an optimum resistance to etching. In some cases, the polymer thus produced in this second embodiment is distinguished by a shiny surface.

At the higher temperature range, the heated polymer-hardening precursor material (e.g., in the silicon ceiling 14 in the present example): (b 1) reduces free fluorine in the plasma by providing scavenging fluorine to the plasma, (2) changes the relative concentrations of carbon to fluorine and hydrogen in the plasma, (3) changes the relative concentrations of etchant species and polymer precursor species in the plasma near the wafer surface. At the maximum temperature range, the heated polymer-hardening precursor material performs (1)–(3) above and (4) contributes polymer-hardening precursor (silicon) material into the polymer, producing a polymer having a resistance to etching beyond what has been heretofore attained in the art.

Efficacy of the invention is seen, for example, in the photoresist selectivity achieved by the invention, although similar improvement in silicon-to-silicon oxide selectivity is also achieved (as described later in this specification). When the polymer hardening precursor material (silicon) is heated to 300° C., sputtering effects are observed at the photoresist facets or corners of features covered by photoresist, and the etch selectivity of oxide to photoresist (the "photoresist selectivity") is only about 3:1. If the polymer hardening precursor material is heated further to about 430° C., then the photoresist selectivity jumps to about 5:1, a significant improvement. If the polymer hardening precursor material temperature is increased even further to about 560° C., then the photoresist selectivity increases to about 6:1.

Carrying out the invention in the reactor chamber of FIGS. 1, 2 or 3 can be accomplished by employing the silicon ceiling 14 or silicon side wall or skirt 12 as the polymer-hardening precursor material and increasing the temperature of the silicon ceiling 14 of FIGS. 1, 2 or 3 (and/or the silicon side wall 12 of FIG. 3) to the requisite temperature. The silicon ceiling 14 (and/or silicon side wall 12), when heated to the higher temperature range of the present invention, becomes a polymer-hardening precursor.

One problem in using the silicon ceiling 14 (or silicon side wall 12) as a fluorine scavenger precursor is that it is consumed at a rate determined at least in part by the amount of RF power coupled to it and must therefore be replaced at more frequent intervals. (RF power can be coupled to the scavenger precursor either directly from an RF power generator or indirectly by capacitive coupling from other chamber surfaces having RF power applied directly thereto). Because the ceiling 14 (and/or side wall 12) is integrated with the temperature control system described above, its replacement entails loss of productivity due to the amount of labor required to remove and replace it, as well as a cost to acquire a new silicon ceiling 14 connectable to the temperature control apparatus. The present invention solves this problem because the process of the invention can further include reducing the RF bias applied by the RF power source 20 to the ceiling 14 (or reducing the RF power applied by the RF power source 22 to the silicon side wall of FIG. 3) while further increasing the silicon ceiling (and/or side wall) temperature to compensate for the reduction in RF bias power. The advantage of this latter feature is that the rate at which silicon is removed from the ceiling 14 (and/or side wall 12) is reduced with the reduction in applied RF power to the ceiling. In one example, the RF power applied by the RF power source 20 to the ceiling 14 may be reduced four-fold while the temperature of the ceiling 14 is increased only moderately from about 200° C. to about 240° C. Thus, the invention provides dual advantages of (a) revolutionary improvement in polymer resistance to etching and (b) reduced consumption rate of the silicon material in the ceiling or side wall. The increased polymer durability results in an increased etch selectivity while the decreased silicon consumption rate results in decreased cost of operation and decreased loss in productivity.

Even though the invention permits a reduction in consumption rate of the polymer-hardening precursor piece (e.g., the silicon ceiling), its replacement is nevertheless expensive and time-consuming due at least in part to its integration with the temperature control apparatus for maintaining the requisite temperature of the piece in accordance with the polymer-hardening process of the present invention. However, the invention is preferably carried out with a separate cheaply fabricated quickly replaceable polymer-hardening precursor piece, to avoid consuming any of the integral parts of the reactor chamber such as the chamber side wall or the chamber ceiling. Such a replaceable polymer-hardening precursor piece can be of any suitable easily fabricated shape (e.g., planar annulus, planar ring, solid ring, cylinder, plate, and so forth) and placed at any suitable location within the reactor chamber. However, in the embodiment of FIG. 4A, the expendable polymer-hardening precursor piece is a thin planar annular ring 60 of a polymer-hardening precursor material (such as silicon) surrounding a peripheral portion of the wafer pedestal 16. While the ring 60 can lie in any suitable plane within the chamber, in order to permit access to the wafer by a conventional wafer transfer mechanism the silicon ring 60 lies slightly below or nearly in the plane of the wafer 17 held on the wafer pedestal 16.

Figure 4A:
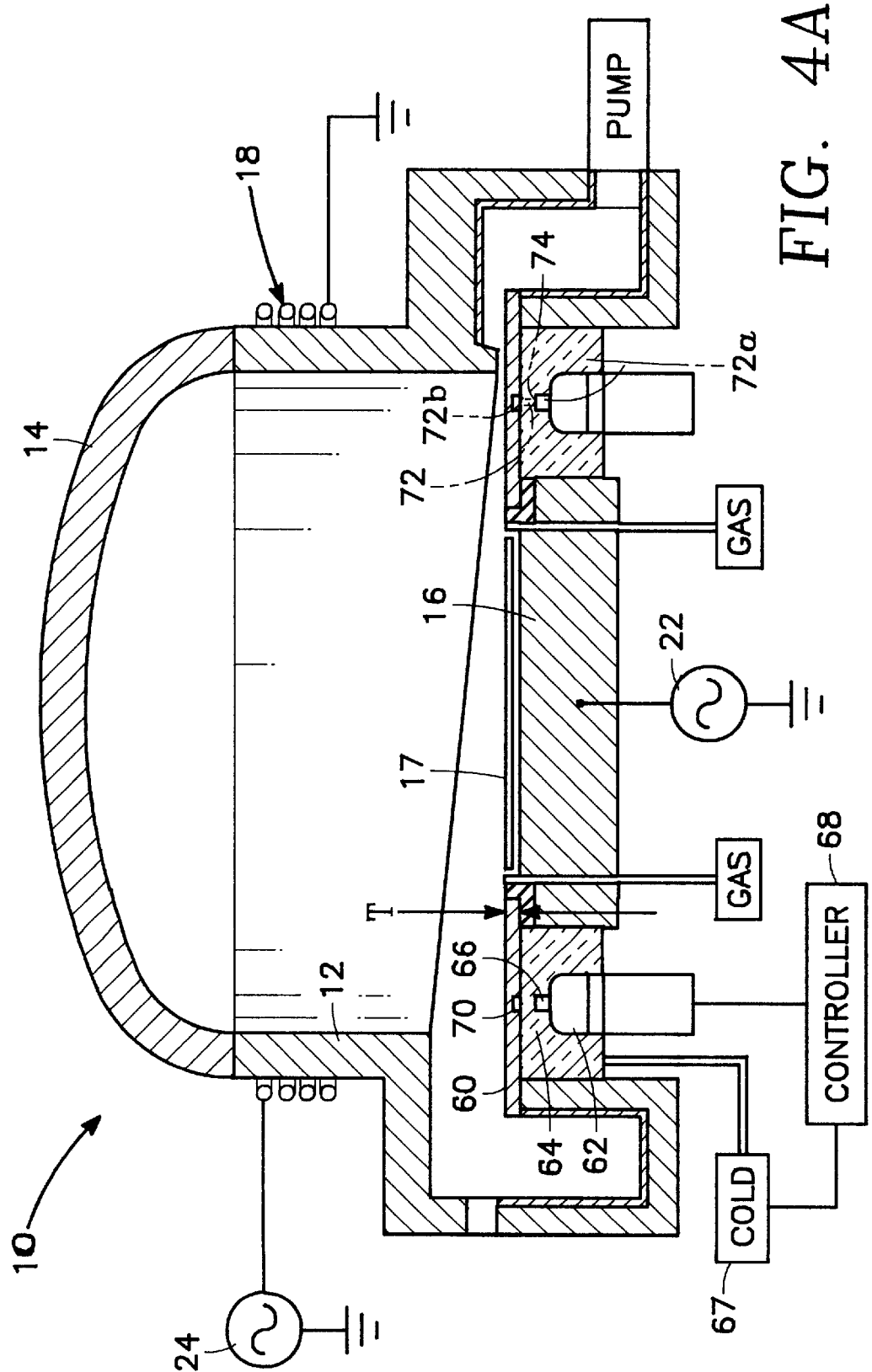
FIG. 4A is a cut-away side view of a plasma reactor in accordance with a preferred embodiment of the present invention employing inductive heating of an expendable polymer-hardening precursor piece.

In order to eliminate any necessity of integrating or mechanically coupling the polymer-hardening precursor ring 60 with a direct temperature control apparatus, heating by a method other than direct conduction (e.g., radiant heating or inductive heating) is preferably employed. A radiant heat source such as a tungsten halogen lamp or an electric discharge lamp may be employed. A radiant or inductive heat source can be internal—unseparated from the ring 60, or it can be external—separated from the ring 60 by a transmissive window for example. In the embodiment of FIG. 4A, an external inductive heater is employed constituting an inductive coil 62 separated from the polymer-hardening precursor ring 60 by a window 64 of a material such as quartz which is at least nearly transparent for purposes of inductive coupling. In order to provide the most efficient inductive heating, the polymer-hardening precursor ring 60 is formed of silicon having a sufficiently low resistivity, for example on the order of 0.01 Ω-cm. The following is an example illustrating how to select the resistivity of a silicon version of the ring 60. If: (a) the thickness T of the ring 60 must be about 0.6 cm (0.25 in) for structural-mechanical purposes, (b) the inductive heater coil 62 is driven at a frequency of 1.8 MHz, (c) an RF skin depth $\delta = \Gamma T$ (for example, $\Gamma = 1$) is desired for optimum absorption efficiency, and (d) the silicon ring 60 has a magnetic permeability $\mu$, then the maximum resistivity of the silicon ring 60 is given by:

$$\rho = \delta^2 \cdot \pi \cdot f \cdot \mu$$

which in the foregoing example is 0.029 $\Omega$-cm. The present invention has been implemented using 0.01 $\Omega$-cm silicon. In the case of a semiconductor such as silicon, there is no risk of falling short of the minimum resistivity in this case and so no computation of the minimum resistivity is given here.

In a working example corresponding to the embodiment of FIG. 4A, 4000 Watts of source power at 2.0 MHz was applied to the inductive coil 18, 1400 Watts of bias power at 1.8 MHz was applied to the wafer pedestal 16, process gases of $CHF_3$ and $CO_2$ were introduced into the reactor chamber at flow rates of 120 sccm and 46 sccm, respectively, while the chamber pressure was maintained at 50 mTorr, the ceiling temperature was maintained at 200° C. and the side wall temperature was maintained at 220° C. The polymer-hardening precursor ring 60 was crystalline silicon and reached a temperature in the range of between 240° C. and 500° C. The polymer deposited onto the silicon and polysilicon surfaces on the wafer 17 was characterized by the shinier appearance of a polymer hardened by the process of the present invention.

Figure 4B:
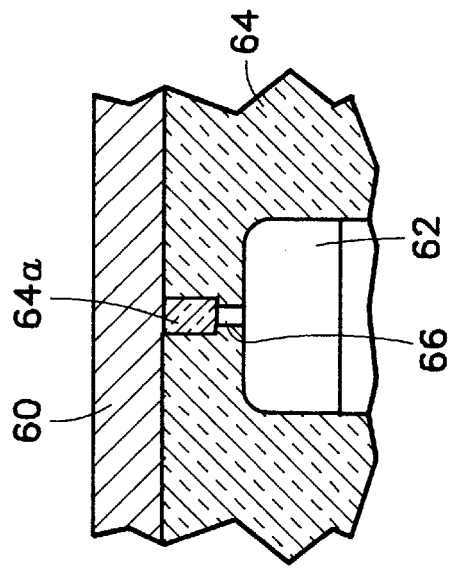
FIG. 4B is an enlarged cross-sectional view of the workpiece processed in a working example of the embodiment of FIG. 4, illustrating the multi-layer conductor structure of the workpiece.

The semiconductor wafer 17 processed in this working example had the multi-layer conductor structure illustrated in FIG. 4B consisting of a silicon substrate 17a, a silicon dioxide layer 17b and a polysilicon conductor line 17c, the etch process being facilitated by a photoresist layer 17d having mask openings 17e, 17f defining the openings 17g, 17h etched through the silicon dioxide layer 17b down to the polysilicon conductor 17c and the substrate 17a, respectively. A very high oxide-to-silicon etch selectivity is necessary to prevent the punchthrough, depending upon the ratio between the depths of the silicon substrate and the intermediate polysilicon layer through the silicon oxide. For the case in which the deep contact opening 17h through the oxide to the substrate is 1.0 micron deep and is to be 50% overetched, the intermediate contact opening 17g to the polysilicon layer is 0.4 microns deep and not more than 0.01 microns of the intermediate polysilicon conductor layer 17c are to be removed (to avoid punch-through), then an oxide-to-silicon etch selectivity of at least 110:1 is required.

Figure 5A:
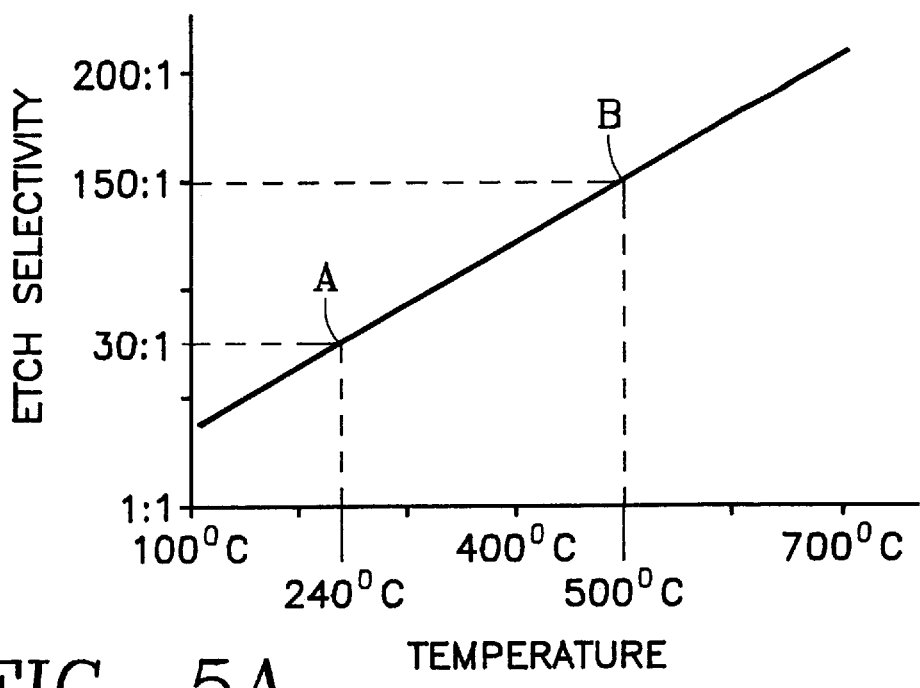
FIG. 5A is a graph illustrating oxide-to-silicon etch selectivity as a function of temperature of a polymer-hardening precursor ring.
Figure 5B:
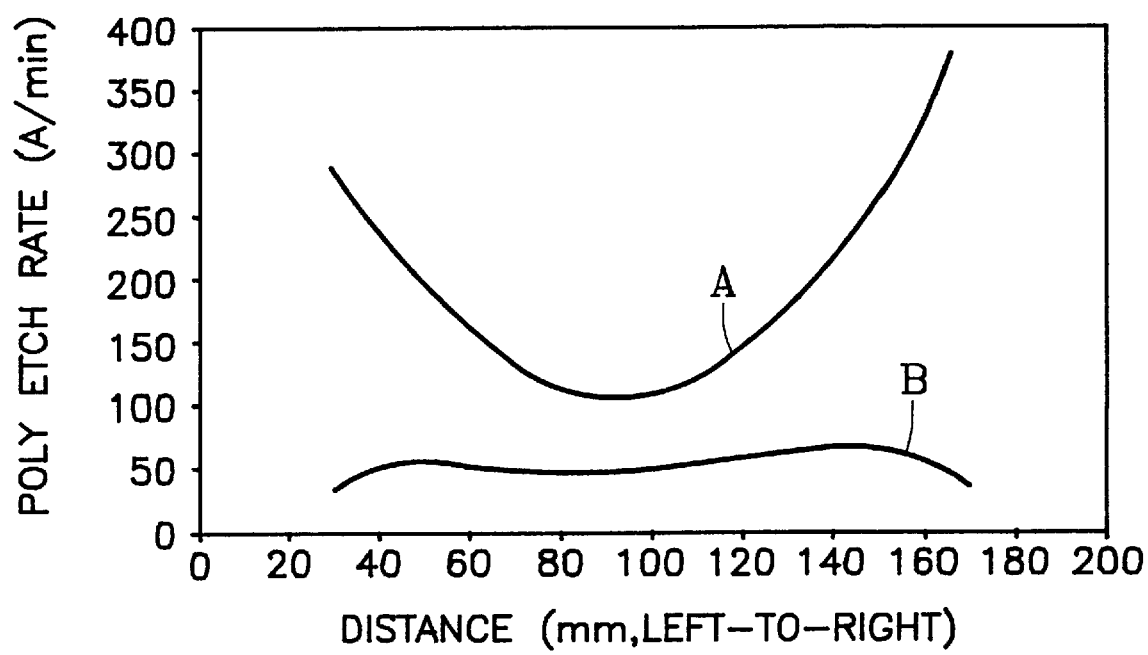
FIG. 5B is a graph illustrating radial distribution of the polysilicon etch rate in angstroms/minute at temperatures of 240° C. and 500° C., respectively.

By increasing the temperature of the silicon ring 60 over the processing of successive wafers, it was found that oxide-to-silicon etch selectivity generally increased with temperature in the manner illustrated in the graph of FIG. 5A. The two data points A and B of FIG. 5A correspond to the curves A and B of FIG. 5B illustrating radial distribution of the polysilicon etch rate in angstroms/minute at temperatures of 240° C. and 500° C., respectively. The etch selectivities of data points A and B of FIG. 5A were computed from the oxide etch rate of 9,000 angstroms/minute observed at both temperatures as an etch selectivity of 30:1 at 240° C. and 150:1 at 500° C. Thus, increasing the temperature to 500° C. provides a selectivity well-above the 110:1 minimum selectivity required in the above-given working example of FIG. 4B.

In the embodiment of FIG. 4A, the temperature of the polymer-hardening precursor ring 60 is sensed by a temperature-sensing device 66 which is not attached to the silicon ring 60. A controller 68 governing the current or power flow through the inductor 62 monitors the output of the temperature-sensing device 66 in order to maintain the temperature of the polymer-hardening precursor ring 60 at the desired temperature. Preferably, the temperature-sensing device 66 is a radiant temperature sensor which responds to radiation from the ring 60 within a particular wavelength range. Such a radiant temperature sensor may be an optical pyrometer responsive to thermal radiation or a fluoro-optical probe which responds to optical pulse-stimulated emission. For this purpose, the window 64 is of a material which is at least sufficiently transmissive within the wavelength range of the sensor 66 to provide an optical signal-to-noise ratio adequate to enable temperature control of the ring 60. Preferably, and in addition, the material of the window 64 (over its range of operating temperatures) does not thermally radiate strongly (relative to the radiation from the silicon ring 60) within the wavelength range of the sensor 66, so that the radiation of the window 64 is practically invisible to the sensor 66 so as to not interfere with its measurement of the silicon ring temperature.

If the polymer-hardening precursor ring 60 is silicon, then one difficulty in measuring its temperature by an optical pyrometer is that the thermal emissivity of silicon varies with temperature. (The silicon emissivity also happens to vary with wavelength and doping level, although it is the temperature dependence of the emissivity that is addressed here). One solution to this problem is to bond a small piece 70 of a black-body or gray-body radiating material such as silicon nitride to the ring 60. Preferably an optical fiber 72 (indicated in dashed line) is placed with one end 72a facing a sensing portion 74 of the sensor 66 and the other end 72b facing the gray-body radiator piece 70 bonded to the ring 60. (If a black-body or gray-body radiating material is not added, then the long-wavelength radiation emitted by the silicon ring 60 at lower (e.g., room) temperatures can be carried by the optical fiber 72 provided the fiber 72 is a long wavelength material such as sapphire or zinc selenide in lieu of the usual optical fiber material of quartz). Since the temperature measurement by the sensor 66 can be degraded by background radiation from the plasma, it is preferred to provide a counter-bore 60a in the ring 60 to shield the optical fiber end 72b from background radiation (e.g., from heated chamber surfaces and from the plasma itself) without requiring any contact between the optical fiber 72 and the ring 60. In addition to or instead of providing the counter-bore 60a to shield the optical fiber end 72b from plasma or background radiation, the wavelength of the sensor 66 can be selected to lie outside the plasma emission band (4 microns to 8 microns). The optical fiber 72 may be employed with or without the gray-body radiator piece 70. The window 64 passes heat to the ring 60 while the optical fiber 72 passes emission from the ring 60 to the temperature sensor 66.

Figure 4C:
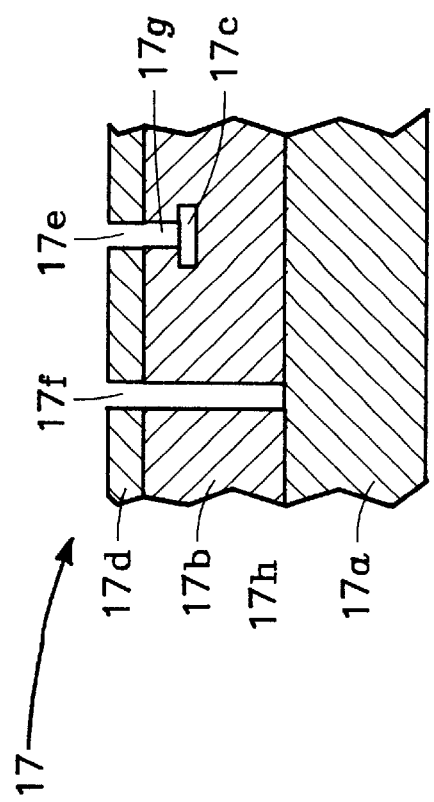
FIG. 4C is an enlarged view corresponding to FIG. 4A illustrating a sleeve and counterbore in which an optical fiber is inserted.

If the temperature measurement is made directly of the silicon (i.e., without the intervening gray-body radiator piece 70), then it is preferable to use a material such as sapphire for the optical fiber 72 which is highly transmissive at the emission wavelength of silicon, and to shield the optical fiber 72 with an opaque shield. Moreover, the problem of the silicon's emissivity varying with temperature may be ameliorated as shown in FIG. 4C by providing, in registration with the counterbore 60a, a hole 60b which is a relatively deep and narrow with a high (e.g., 5:1) aspect ratio, the optical fiber 72 being sunk into the counterbore 60a to prevent background optical noise from entering the fiber end and an opaque shield 72c surrounding the remainder of the optical fiber 72. Such a deep hole may extend axially in the silicon ring 60 but preferably it extends radially from the circumferential edge of the silicon ring 60.

In this implementation, virtually none of the optical radiation from a heater lamp or from the plasma itself can enter the optical fiber 72 to interfere with the temperature measurement.

Figure 4D:
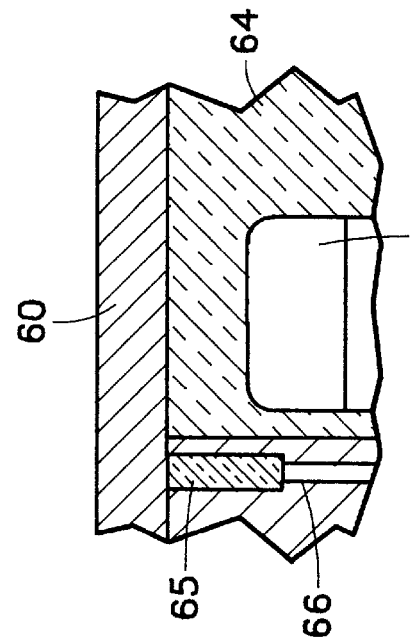
FIG. 4D is an enlarged view corresponding to FIG. 4A illustrating a long wavelength optical window inside a heat transparent window.
Figure 4E:
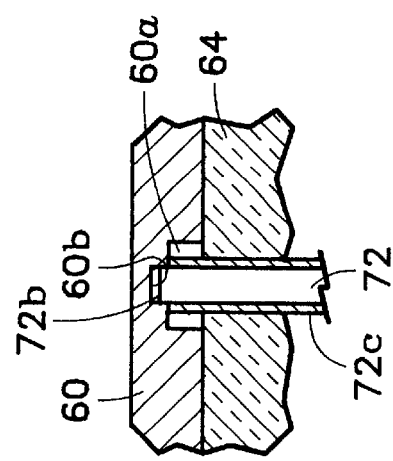
FIG. 4E is an enlarged view corresponding to FIG. 4A illustrating a long wavelength window separate from a heat transparent window.

If the ring temperature is to be sensed through the window 64 in the absence of the optical fiber 72, then another difficulty with measuring the temperature of the silicon ring 60 is that below 200° C. its peak thermal emission wavelength is shifted to a very long wavelength, well outside the optical passband of typical materials such as quartz that can be used for the window 64. Quartz typically is transparent between about 300 nm and 3 microns, while silicon's peak thermal emission wavelength varies from 4 microns at 400° C. to 10 microns at room temperature. Thus, the range of directly measurable the silicon ring temperatures is limited, since silicon below about 200° C. does not appreciably radiate within the optical passband of quartz. One solution illustrated in FIG. 4D is to employ a small port 64a within the quartz window 64, the small port 64a being of a material which is transparent at the long wavelengths emitted by silicon at cooler temperatures down to room temperature. The small port 64a can be sapphire or zinc selenide. The radiant temperature sensor 66 would be selected to be responsive at the longer wavelengths passed by the small port 64a. Alternatively, instead of the small long-wavelength port 64a within the window 64, a separate long-wavelength port 65 illustrated in FIG. 4E outside of the window 64 may be employed and may be made of sapphire or zinc selenide. The long wavelength port 65 may be replaced by its equivalent, a long wavelength version of the optical fiber 72, such as a sapphire optical fiber.

If the sensor 66 is a fluoroptical probe, then it is unaffected by the thermal emissivity of the ring 60. In this case, a fluorescent substance or powder is immersed in the surface of a small region of the ring 60 aligned with the optical fiber end 72b. An optical pulse is applied periodically to the other fiber end 72a and the resulting optical pulse-stimulated emission from the fluorescent powder (in the ring 60) travels from the fiber end 72b to the fiber end 72a to be analyzed by the sensor 66 to determine the ring temperature. A counterbore in the ring 60 shields the optical fiber end 72b from background radiation.

In order to radiantly cool the ring 60, the window 64 may be cooled by conventional means, for example by providing a cold sink for radiant cooling of the polymer-hardening precursor ring 60. In this case, the rate at which the polymer-hardening precursor ring 60 is cooled is a function of $[T_{ring}]^4 - [T_{window}]^4$, where $T_{ring}$ and $T_{window}$ are the absolute temperatures (Kelvin), respectively, of the polymer-hardening precursor ring 60 and the cooled window 64. Efficient radiant cooling of the ring 60 is attained by maintaining a 200° C. temperature difference between the silicon ring 60 and the window 64, which is readily accomplished by conventional liquid or gas cooling apparatus 67 in contact with the window 64, provided the ring 60 is maintained within the preferred temperature range of 300° C. and 700° C. However, the ring may instead be cooled using any one of a number of conventional techniques. For example, it may be cooled in the manner that the wafer is typically cooled.

Whether the ring 60 is conductively cooled by a conventional cold plate or is radiantly cooled by the window 64, in some cases it may not be necessary to provide a heat source (such as the tungsten halogen lamps). Instead, heating by the plasma itself may be more than sufficient to heat the ring 60, in conjunction with the conductive or radiant cooling, to maintain stable temperature control of the ring 60 within the requisite temperature range. Thus, in an alternative embodiment, no heat source is provided.

Figure 6:
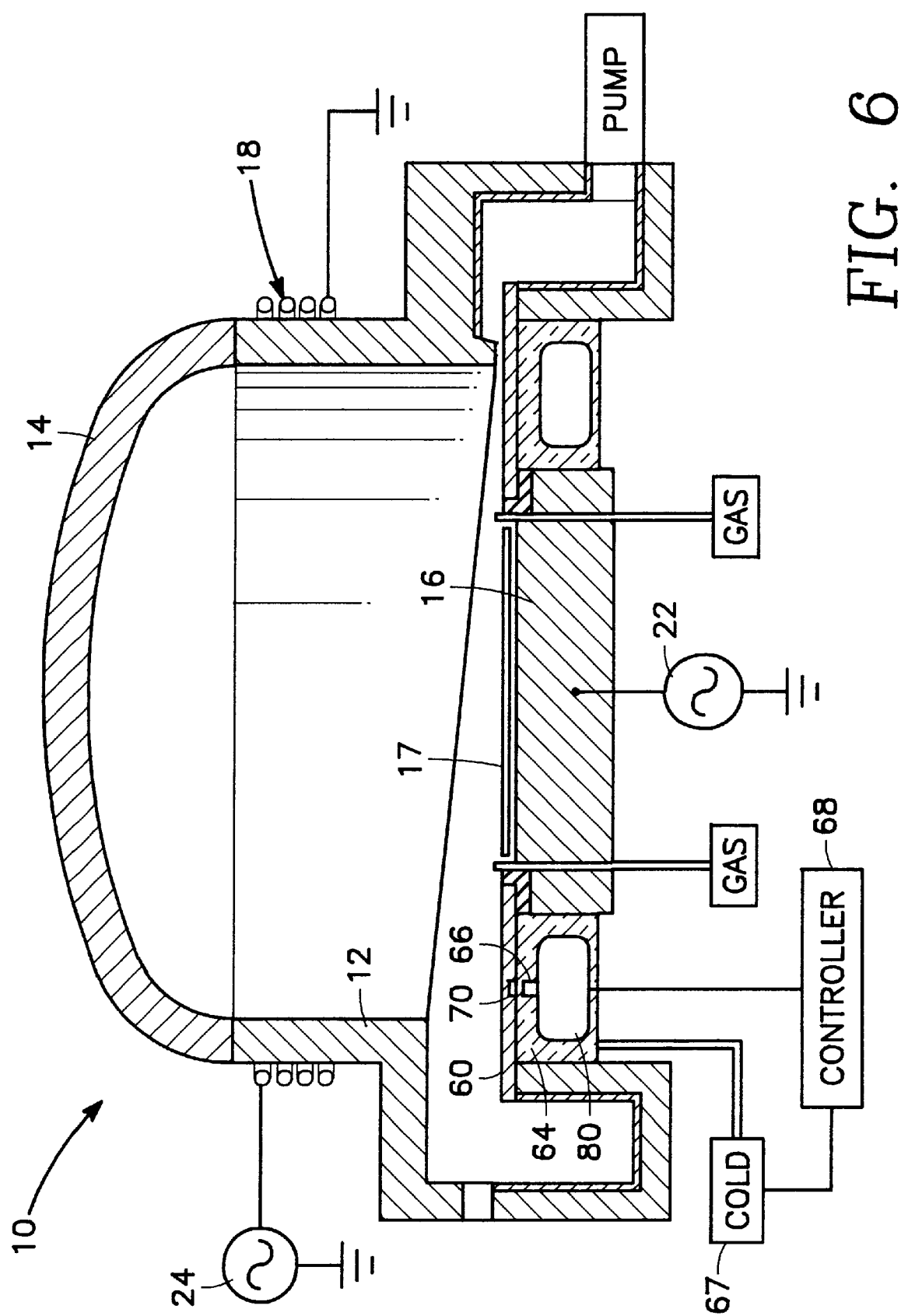
FIG. 6 is a cut-away view of a plasma reactor in accordance with another preferred embodiment of the invention employing radiant or infrared heating of an expendable polymer-hardening precursor piece.

In the embodiment of FIG. 6, the inductive heating coil 62 is replaced by a radiant heater 80 such as a tungsten-halogen lamp or an electric discharge lamp which emits electromagnetic radiation of a wavelength within the optical transmission band of the quartz window 64 (to avoid heating the window 64) and within the absorption band of the polymer-hardening precursor ring 60. Preferably, the wavelength of the emission from the radiant heater 80 differs from the wavelength of the emission from the polymer-hardening precursor ring 60 in order to avoid interfering with the temperature measurement performed by the optical pyrometer 66. However, if the optical fiber 72 is sunk into the counterbore 60a and if the optical fiber is completely shielded by the opaque shield 72c that extends down to the top of the counterbore 60a, then the radiant heater emission cannot interfere with the temperature measurement, and so it is not required, in this case, that the radiant heater emission wavelength differ from the emission wavelength of the (silicon) ring 60. In fact, this is advantageous since a number of commercially available detectors that could be installed at the output end of the optical fiber are more stable near the short emission wavelength range $(1-2\mu)$ of silicon. In this case, the temperature measurement is performed at shorter wavelengths so that the long wavelength port 64a or 65 or long wavelength (e.g., sapphire) optical fiber is not required.

To summarize the requirements for optimum radiant heating and radiant temperature sensing: (a) the material of the window 64 is highly transmissive at the wavelength of the radiant heat source 80 and either the window 64 itself or a small assigned portion of it or an optical fiber through it is highly transmissive at the wavelength to which the temperature sensor 66 is responsive but is not itself highly radiant at that wavelength; (b) the polymer-hardening precursor ring 60 is highly absorbing at the wavelength of the radiant heater 80 and either the ring 60 itself or a material embedded in or on it is radiant at the wavelength at which the sensor 66 responds; and (c) the wavelength of the radiant heater 80 does not coincide with the wavelength at which the sensor 66 is responsive and yet lies within the absorption spectrum of the polymer precursor ring 60 and outside the absorption spectrum of the window 64.

The foregoing requirements can be met in various ways, for example by first specifying the materials of the polymer-hardening precursor ring 60 and then selecting a compatible material for the window 64 and then finally selecting the wavelengths of the radiant heater and the sensor 66 by process of elimination, or else specifying the wavelengths of the sensor 66 and the radiant heater and then selecting the materials by process of elimination. The foregoing requirements may be relaxed to an extent depending upon the sensitivity of the temperature measurement and temperature control precision desired.

If radiant cooling is desired, then further requirements are imposed upon the window 64: (a) in the portion of the window 64 through which the sensor 66 views the ring 60 the window 64 is at least nearly transparent to the wavelength of radiation emitted by the heated ring 60 (as stated above), while (b) in other portions of the window 64 not used by the sensor 66 to view the ring 60 the window 64 has an absorption spectrum which includes the reradiation wavelength of the radiantly heated polymer-hardening precursor ring 60, so as to absorb heat therefrom to provide radiant cooling.

One way of reducing the number simultaneous constraints on the material of the window 64 is to not require the window 64 to transmit both heat to the ring 60 and the ring's thermal emission to the sensor 66. This is accomplished by employing the small long-wavelength (zinc selenide or sapphire) port 64a or auxiliary window 65 for exclusive use by the sensor 66 or to employ the optical fiber 72 for exclusive use by the sensor 66, in either case reducing the function of the window 64 to transmitting radiation from the heat source only. In this case, if radiant cooling is desired, then the only other constraint on the window is that it absorb emission from the ring 60. This is possible as long as the emission wavelength of the radiant heat source 80 and the ring emission are of different wavelengths. Furthermore, it is preferred that the sensor 66 is not responsive at the wavelengths emitted by the radiant heat source 80.

In one working example, the polymer-hardening precursor ring 60 was crystalline silicon with a resistivity of 0.01 Ω-cm and an average emissivity between 0.3 and 0.7, the window 64 was quartz with an optical passband between 300 nm and 3 microns, the sensor 66 was an optical pyrometer that sensed radiation through an optical fiber (corresponding to the optical fiber 72) in a wavelength range of 4–10 microns and the radiant heater 80 was a 3000° K tungsten-halogen lamp with a peak power emission wavelength range of 0.9–1.0 micron. It should be noted that optical pyrometry in either a visible or non-visible wavelength range may be employed in carrying out the invention.

Figure 7:
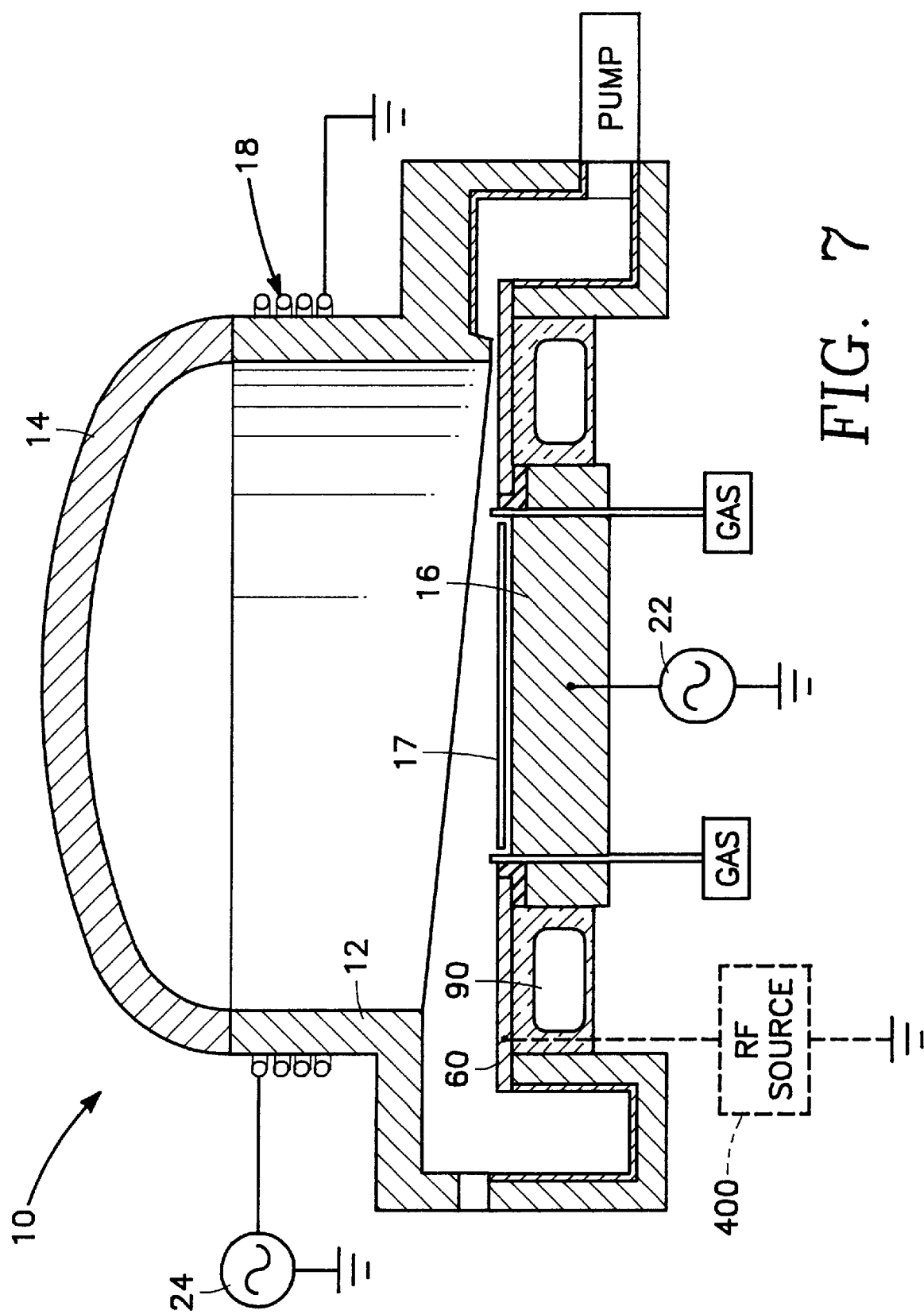
FIG. 7 is a cut-away view of a plasma reactor in accordance with a preferred embodiment of the invention in which an expendable polymer-hardening precursor piece is heated in an all-semiconductor reactor chamber.

Referring now to a preferred embodiment illustrated in FIG. 7, an expendable polymer-hardening precursor ring 60 of silicon is added to the all-semiconductor (silicon) reactor chamber of FIG. 3 and heated by a heating device 90 which may be either an induction heater or a radiant heater. Optionally, and in addition, a separate RF bias source 400 may be connected to the ring 60 to help, along with the heating of the ring 60, to maintain the ring 60 reactive with the plasma and furnish polymer-hardening precursor material therefrom into the plasma. The advantage is that none of the silicon window electrodes (e.g., the silicon side wall 12 or the silicon ceiling 14) are used to provide silicon to the polymer chemistry and therefore they need not be heated to the elevated temperatures (e.g., over 200° C. to 700° C.) to which a polymer-hardening precursor must be heated. Moreover, the RF bias power applied to the silicon wall 12 and the silicon ceiling 14 need not be so high as to promote consumption of the silicon material thereof. In fact, it may be preferable to apply no bias to the walls and ceiling. Preferably, the temperature of the silicon ceiling 14 and of the silicon side wall 12 and the RF power applied thereto are selected to minimize consumption thereof by etching, sputtering or ion bombardment thereof while maintaining their surfaces relatively free of polymer accumulation, to avoid frequent chamber cleaning operations. The best mode for accomplishing this is the light deposition mode referred to earlier in this specification. In a light deposition mode carried out during a two-minute plasma etch/polymer deposition process, the silicon wall temperature is maintained near 100° C.–150° C., and the resulting polymer deposition thereon is sufficiently light so that it can be removed subsequently by a 10 to 20 second exposure to a high density oxygen plasma temporarily generated in the chamber following etching of the wafer. Alternatively, but not preferably, a heavy deposition mode may be employed in which the silicon chamber walls are held near room temperature (for example) during the etch process.

Figure 8A:
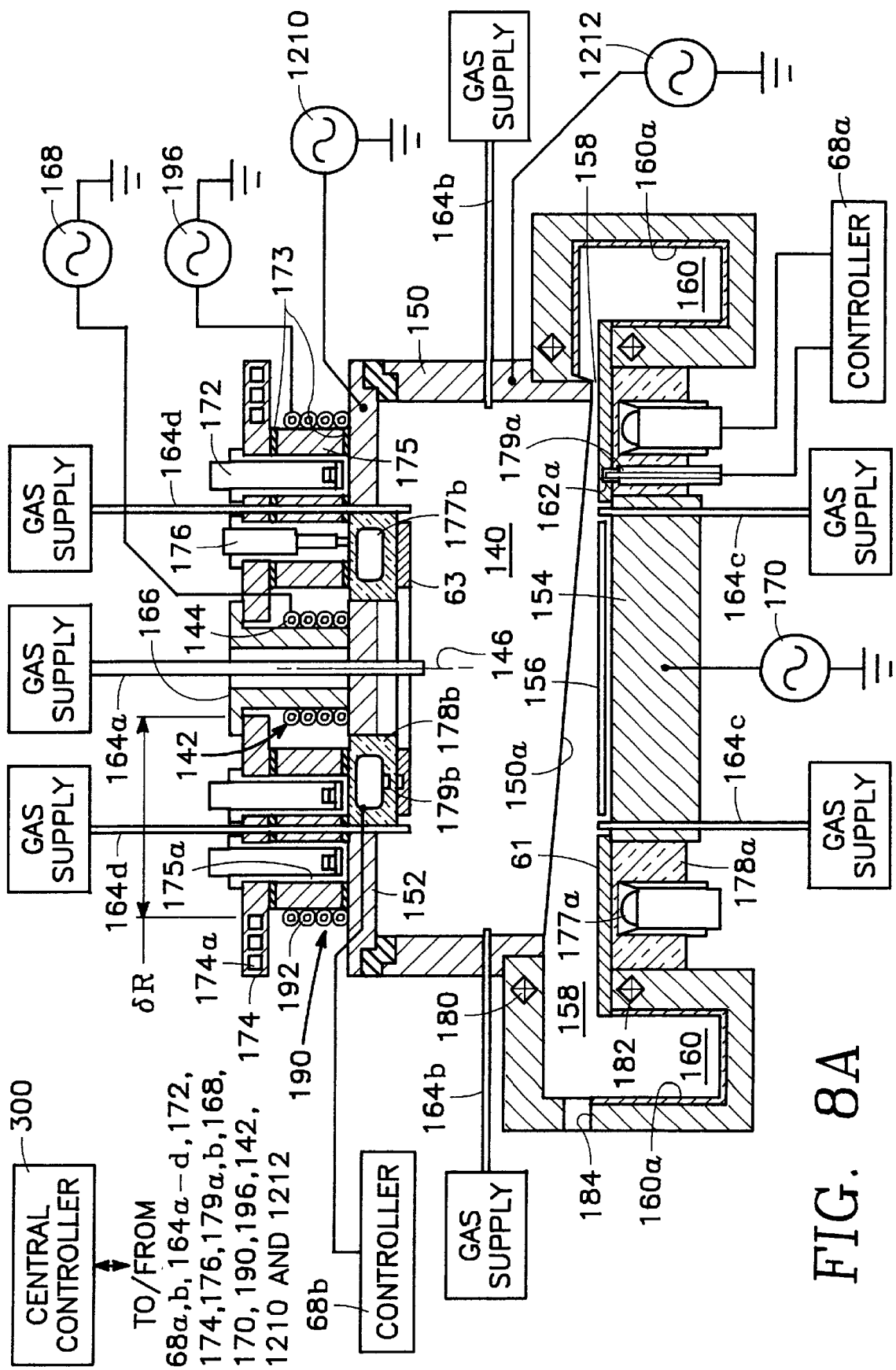
FIG. 8A is a cut-away side view of a plasma reactor in accordance with a preferred embodiment employing heated polymer-hardening precursor pieces at separate radial locations relative to the wafer being processed.

Referring to FIG. 8A, separate independently controllable polymer-hardening precursor rings 61, 63 are placed at different radial locations relative to the wafer to permit further compensation for radially non-uniform processing conditions. The separate outer and inner polymer-hardening precursor ring 61, 63 of FIG. 8A are independently controlled by respective inductive or radiant heaters 80a, 80b, respective sensors 66a, 66b with respective windows 64a, 64b and respective temperature controllers 68a, 68b. In order to compensate for processing conditions giving rise to different etch selectivities at different radial locations on the wafer 17, the user may select different polymer-hardening precursor ring temperatures to be maintained by the different temperature controllers 68a, 68b.

While any suitable reactor configuration may be employed in carrying out an embodiment having the separately controlled outer and inner polymer-hardening precursor rings 61, 63, the implementation illustrated in FIG. 8A employs a reactor having a solenoidal antenna over a heated semiconductor window electrode ceiling of the type disclosed in above-referenced co-pending U.S. application Ser. No. 08/648,254 filed May 13, 1996 by Kenneth S. Collins et al. entitled "Inductively Coupled RF Plasma Reactor Having Overhead Solenoidal Antenna". Notably, the presently preferred implementation of the present invention employs the reactor of the above-referenced co-pending application but with only the outer polymer-hardening precursor ring 61. The reactor of the above-referenced co-pending application includes a cylindrical chamber 140 having a non-planar coil antenna 142 whose windings 144 are closely concentrated in non-planar fashion near the center axis 146 of the cylindrical chamber 140. While in the illustrated embodiment the windings 144 are symmetrical and have an axis of symmetry coinciding with the center axis of the chamber, the invention may be carried out differently. For example, the windings may not be symmetrical and/or their axis of symmetry may not coincide with the center of the chamber or the workpiece center. Close concentration of the windings 144 about the center axis 146 is accomplished by vertically stacking the windings 144 in the manner of a solenoid so that they are each a minimum distance from the chamber center axis 146. This increases the product of current (I) and coil turns (N) near the chamber center axis 146 where the plasma ion density has been the weakest for short workpiece-to-ceiling heights. As a result, the RF power applied to the non-planar coil antenna 142 produces greater induction [d/dt] [N·I] near the chamber center axis 146 (relative to the peripheral regions) and therefore greater plasma ion density in that region, so that the resulting plasma ion density is more nearly uniform despite the small workpiece-to-ceiling height. Thus, the invention provides a way for reducing the ceiling height for enhanced plasma process performance without sacrificing process uniformity.

In order that the windings 144 be at least nearly parallel to the plane of the workpiece 156, they preferably are not wound in the usual manner of a helix but, instead, are preferably wound so that each individual turn is parallel to the (horizontal) plane of the workpiece 156 except at a step or transition between turns (from one horizontal plane to the next).

The cylindrical chamber 140 consists of a cylindrical side wall 150 and a circular ceiling 152 which can be integrally formed with the side wall 150 so that the side wall 150 and ceiling 152 can constitute a single piece of material, such as silicon. However, the preferred embodiment illustrated FIG. 8A has the side wall 150 and ceiling 152 formed as separate pieces. The circular ceiling 152 may be of any suitable cross-sectional shape such as planar, dome, conical, truncated conical, cylindrical or any combination of such shapes or curve of rotation. Generally, the vertical pitch of the solenoid 142 (i.e., its vertical height divided by its horizontal width) exceeds the vertical pitch of the ceiling 152, even for ceilings defining 3-dimensional surfaces such as dome, conical, truncated conical and so forth. A solenoid having a pitch exceeding that of the ceiling is referred to herein as a non-conformal solenoid, meaning that, in general, its shape does not conform with the shape of the ceiling, and more specifically that its vertical pitch exceeds the vertical pitch of the ceiling.

A pedestal 154 at the bottom of the chamber 140 supports a workpiece 156, such as a semiconductor wafer, which is to be processed. The chamber 140 is evacuated by a pump (not shown in the drawing) through an annular passage 158 to a pumping annulus 160 surrounding the lower portion of the chamber 140. The interior of the pumping annulus may be lined with a replaceable metal liner 160a. The annular passage 158 is defined by the bottom edge 150a of the cylindrical side wall 150 and a planar ring 162 surrounding the pedestal 154. Process gas is furnished into the chamber 140 through any one or all of a variety of gas feeds. In order to control process gas flow near the workpiece center, a center gas feed 164a can extend downwardly through the center of the ceiling 152 toward the center of the workpiece 156. In order to control gas flow near the workpiece periphery, plural radial gas feeds 164b, which can be controlled independently of the center gas feed 164a, extend radially inwardly from the side wall 150 toward the workpiece periphery, or base axial gas feeds 164c extend upwardly from near the pedestal 154 toward the workpiece periphery, or ceiling axial gas feeds 164d can extend downwardly from the ceiling 152 toward the workpiece periphery. Etch rates at the workpiece center and periphery can be adjusted independently relative to one another to achieve a more radially uniform etch rate distribution across the workpiece by controlling the process gas flow rates toward the workpiece center and periphery through, respectively, the center gas feed 164a and any one of the outer gas feeds 164b–d. This feature of the invention can be carried out with the center gas feed 164a and only one of the peripheral gas feeds 164b–d.

The solenoidal coil antenna 142 is wound around a housing 166 surrounding the center gas feed 164. A plasma source RF power supply 168 is connected across the coil antenna 142 and a bias RF power supply 170 is connected to the pedestal 154.

Confinement of the overhead coil antenna 142 to the center region of the ceiling 152 leaves a large portion of the top surface of the ceiling 152 unoccupied and therefore available for direct contact with temperature control apparatus including, for example, plural radiant heaters 172 such as tungsten halogen lamps and a water-cooled cold plate 174 which may be formed of copper or aluminum for example, with coolant passages 174a extending therethrough. Preferably the coolant passages 174a contain a coolant of a known variety having a high thermal conductivity but a low electrical conductivity, to avoid electrically loading down the antenna or solenoid 142. The cold plate 174 provides constant cooling of the ceiling 152 while the maximum power of the radiant heaters 172 is selected so as to be able to overwhelm, if necessary, the cooling by the cold plate 174, facilitating responsive and stable temperature control of the ceiling 152. The large ceiling area irradiated by the heaters 172 provides greater uniformity and efficiency of temperature control. (It should be noted that radiant heating is not necessarily required in carrying out the invention, and the skilled worker may choose to employ an electric heating element instead, as will be described later in this specification). If the ceiling 152 is silicon, as disclosed in co-pending U.S. application Ser. No. 08/597,577 filed Feb. 2, 1996 by Kenneth S. Collins et al., then there is a significant advantage to be gained by thus increasing the uniformity and efficiency of the temperature control across the ceiling. Specifically, where a polymer precursor and etchant precursor process gas (e.g., a fluorocarbon gas) is employed and where the etchant (e.g., fluorine) must be scavenged, the rate of polymer deposition across the entire ceiling 152 and/or the rate at which the ceiling 152 furnishes a fluorine etchant scavenger material (silicon) into the plasma is better controlled by increasing the contact area of the ceiling 152 with the temperature control heater 172. The solenoid antenna 142 increases the available contact area on the ceiling 152 because the solenoid windings 144 are concentrated at the center axis of the ceiling 152.

The increase in available area on the ceiling 152 for thermal contact is exploited in a preferred implementation by a highly thermally conductive torus 175 (formed of a ceramic such as aluminum nitride, aluminum oxide or silicon nitride or of a non-ceramic like silicon either lightly doped or undoped) whose bottom surface rests on the ceiling 152 and whose top surface supports the cold plate 174. One feature of the torus 175 is that it displaces the cold plate 174 well-above the top of the solenoid 142. This feature substantially mitigates or nearly eliminates the reduction in inductive coupling between the solenoid 142 and the plasma which would otherwise result from a close proximity of the conductive plane of the cold plate 174 to the solenoid 142. In order to prevent such a reduction in inductive coupling, it is preferable that the distance between the cold plate 174 and the top winding of the solenoid 142 be at least a substantial fraction (e.g., one half) of the total height of the solenoid 142. Plural axial holes 175a extending through the torus 175 are spaced along two concentric circles and hold the plural radiant heaters or lamps 172 and permit them to directly irradiate the ceiling 152. For greatest lamp efficiency, the hole interior surface may be lined with a reflective (e.g., aluminum) layer. The ceiling temperature is sensed by a sensor such as a thermocouple 176 extending through one of the holes 175a not occupied by a lamp heater 172. For good thermal contact, a highly thermally conductive elastomer 173 such as silicone rubber impregnated with boron nitride is placed between the ceramic torus 175 and the copper cold plate 174 and between the ceramic torus 175 and the silicon ceiling 152.

In the embodiment of FIG. 8A, the chamber 140 may be an all-semiconductor chamber, in which case the ceiling 152 and the side wall 150 are both a semiconductor material such as silicon. Controlling the temperature of, and RF bias power applied to, either the ceiling 152 or the wall 150 regulates the extent to which it furnishes fluorine scavenger precursor material (silicon) into the plasma or, alternatively, the extent to which it is coated with polymer. The material of the ceiling 152 is not limited to silicon but may be, in the alternative, silicon carbide, silicon dioxide (quartz), silicon nitride or a ceramic.

The chamber wall or ceiling 150, 152 need not be used as the source of a fluorine scavenger material. Instead, a disposable silicon member can be placed inside the chamber 140 and maintained at a sufficiently high temperature to prevent polymer condensation thereon and permit silicon material to be removed therefrom into the plasma as fluorine scavenging material. In this case, the wall 150 and ceiling 152 need not necessarily be silicon, or if they are silicon they may be maintained at a temperature (and/or RF bias) near or below the polymer condensation temperature (and/or a polymer condensation RF bias threshold) so that they are coated with polymer from the plasma so as to be protected from being consumed. While the disposable silicon member may take any appropriate form, in the embodiment of FIG. 8A the disposable or expendable silicon member is an annular ring 162 surrounding the pedestal 154. Preferably, the annular ring 162 is high purity silicon and may be doped to alter its electrical or optical properties. In order to maintain the silicon ring 162 at a sufficient temperature to ensure its favorable participation in the plasma process (e.g., its contribution of silicon material into the plasma for fluorine scavenging), plural radiant (e.g., tungsten halogen lamp) heaters 177 arranged in a circle under the annular ring 162 heat the silicon ring 162 through a quartz window 178. As described in the above-referenced co-pending application, the heaters 177 are controlled in accordance with the measured temperature of the silicon ring 162 sensed by a temperature sensor 179 which may be a remote sensor such as an optical pyrometer or a fluoro-optical probe. The sensor 179 may extend partially into a very deep hole 162a in the ring 162, the deepness and narrowness of the hole tending at least partially to mask temperature-dependent variations in thermal emissivity of the silicon ring 162, so that it behaves more like a gray-body radiator for more reliable temperature measurement.

As described in U.S. application Ser. No. 08/597,577 referred to above, an advantage of an all-semiconductor chamber is that the plasma is free of contact with contaminant producing materials such as metal, for example. For this purpose, plasma confinement magnets 180, 182 adjacent the annular opening 158 prevent or reduce plasma flow into the pumping annulus 160. To the extent any polymer precursor and/or active species succeeds in entering the pumping annulus 160, any resulting polymer or contaminant deposits on the replaceable interior liner 160a may be prevented from re-entering the plasma chamber 140 by maintaining the liner 160a at a temperature significantly below the polymer condensation temperature, for example, as disclosed in the referenced co-pending application.

A wafer slit valve 184 through the exterior wall of the pumping annulus 160 accommodates wafer ingress and egress. The annular opening 158 between the chamber 140 and pumping annulus 160 is larger adjacent the wafer slit valve 184 and smallest on the opposite side by virtue of a slant of the bottom edge of the cylindrical side wall 150 so as to make the chamber pressure distribution more symmetrical with a non-symmetrical pump port location.

Maximum inductance near the chamber center axis 146 is achieved by the vertically stacked solenoidal windings 144.

A second outer vertical stack or solenoid 1120 of windings 1122 at an outer location (i.e., against the outer circumferential surface of the thermally conductive torus 175) is displaced by a radial distance $\delta R$ from the inner vertical stack of solenoidal windings 144. Note that confinement of the inner solenoidal antenna 142 to the center and the outer solenoidal antenna 1120 to the periphery leaves a large portion of the top surface of the ceiling 152 available for direct contact with the temperature control apparatus 172, 174, 175. An advantage is that the larger surface area contact between the ceiling 152 and the temperature control apparatus provides a more efficient and more uniform temperature control of the ceiling 152.

For a reactor in which the side wall and ceiling are formed of a single piece of silicon for example with an inside diameter of 12.6 in (32 cm), the wafer-to-ceiling gap is 3 in (7.5 cm), and the mean diameter of the inner solenoid was 3.75 in (9.3 cm) while the mean diameter of the outer solenoid was 11.75 in (29.3 cm) using $\frac{3}{16}$ in diameter hollow copper tubing covered with a 0.03 thick Teflon insulation layer, each solenoid consisting of four turns and being 1 in (2.54 cm) high. The outer stack or solenoid 1120 is energized by a second independently controllable plasma source RF power supply 196. The purpose is to permit different user-selectable plasma source power levels to be applied at different radial locations relative to the workpiece or wafer 56 to permit compensation for known processing non-uniformities across the wafer surface, a significant advantage. In combination with the independently controllable center gas feed 164a and peripheral gas feeds 164b–d, etch performance at the workpiece center may be adjusted relative to etch performance at the edge by adjusting the RF power applied to the inner solenoid 142 relative to that applied to the outer solenoid 190 and adjusting the gas flow rate through the center gas feed 164a relative to the flow rate through the outer gas feeds 164b–d. While the present invention solves or at least ameliorates the problem of a center null or dip in the inductance field as described above, there may be other plasma processing non-uniformity problems, and these can be compensated in the versatile embodiment of FIG. 8A by adjusting the relative RF power levels applied to the inner and outer antennas. For effecting this purpose with greater convenience, the respective RF power supplies 168, 196 for the inner and outer solenoids 142, 190 may be replaced by a common power supply 197a and a power splitter 197b which permits the user to change the relative apportionment of power between the inner and outer solenoids 142, 190 while preserving a fixed phase relationship between the fields of the inner and outer solenoids 142, 190. This is particularly important where the two solenoids 142, 190 receive RF power at the same frequency. Otherwise, if the two independent power supplies 168, 196 are employed, then they may be powered at different RF frequencies, in which case it is preferable to install RF filters at the output of each RF power supply 168, 196 to avoid off-frequency feedback from coupling between the two solenoids. In this case, the frequency difference should be sufficient to time-average out coupling between the two solenoids and, furthermore, should exceed the rejection bandwidth of the RF filters. A preferred mode is to make each frequency independently resonantly matched to the respective solenoid, and each frequency may be varied to follow changes in the plasma impedance (thereby maintaining resonance) in lieu of conventional impedance matching techniques. In such implementations, the frequency ranges of the two solenoids should be mutually exclusive. Alternatively, the two solenoids are driven at the same RF frequency and in this case it is preferable that the phase relationship between the two be such as to cause constructive interaction or superposition of the fields of the two solenoids. Generally, this requirement will be met by a zero phase angle between the signals applied to the two solenoids if they are both wound in the same sense. Otherwise, if they are oppositely wound, the phase angle is preferably 180°. In any case, coupling between the inner and outer solenoids can be minimized or eliminated by having a relatively large space between the inner and outer solenoids 142, 190, as will be discussed below in this specification.

The range attainable by such adjustments is increased by increasing the radius of the outer solenoid 910 to increase the spacing between the inner and outer solenoids 142, 190, so that the effects of the two solenoids 142, 190 are more confined to the workpiece center and edge, respectively. This permits a greater range of control in superimposing the effects of the two solenoids 142, 190. For example, the radius of the inner solenoid 142 should be no greater than about half the workpiece radius and preferably no more than about a third thereof. (The minimum radius of the inner solenoid 142 is affected in part by the diameter of the conductor forming the solenoid 142 and in part by the need to provide a finite non-zero circumference for an arcuate—e.g., circular—current path to produce inductance). The radius of the outer coil 190 should be at least equal to the workpiece radius and preferably 1.5 or more times the workpiece radius. With such a configuration, the respective center and edge effects of the inner and outer solenoids 142, 190 are so pronounced that by increasing power to the inner solenoid the chamber pressure can be raised into the hundreds of mT while providing a uniform plasma, and by increasing power to the outer solenoid 190 the chamber pressure can be reduced to on the order of 0.01 mT while providing a uniform plasma. Another advantage of such a large radius of the outer solenoid 190 is that it minimizes coupling between the inner and outer solenoids 142, 190.

In the embodiment of FIG. 8A, the ceiling 152 and side wall 150 are separate semiconductor (e.g., silicon) pieces insulated from one another having separately controlled RF bias power levels applied to them from respective RF sources 1210, 1212 to enhance control over the center etch rate and selectivity relative to the edge. As set forth in greater detail in above-referenced U.S. application Ser. No. 08/597,577 filed Feb. 2, 1996 by Kenneth S. Collins et al., the ceiling 152 may be a semiconductor (e.g., silicon) material doped so that it will act as an electrode capacitively coupling the RF bias power applied to it into the chamber and simultaneously as a window through which RF power applied to the solenoid 142 may be inductively coupled into the chamber. The advantage of such a window-electrode is that an RF potential may be established directly over the wafer (e.g., for controlling ion energy) while at the same time inductively coupling RF power directly over the wafer. This latter feature, in combination with the separately controlled inner and outer solenoids 142, 190 and center and peripheral gas feeds 164a, 164b greatly enhances the ability to adjust various plasma process parameters such as ion density, ion energy, etch rate and etch selectivity at the workpiece center relative to the workpiece edge to achieve an optimum uniformity. In this combination, pressure and/or gas volume through individual gas feeds is individually and separately controlled to achieve such optimum uniformity of plasma process parameters.

The lamp heaters 172 may be replaced by electric heating elements. The disposable silicon member is an annular ring 62 surrounding the pedestal 54. Preferably, the annular ring 62 is high purity silicon and may be doped to alter its electrical or optical properties. In order to maintain the silicon ring 62 at a sufficient temperature to ensure its favorable participation in the plasma process (e.g., its contribution of silicon material into the plasma for fluorine scavenging), plural radiant (e.g., tungsten halogen lamps) heaters 177 arranged in a circle under the annular ring 162 heat the silicon ring 162 through a quartz window 178. As described in the above-referenced co-pending application, the heaters 177 are controlled in accordance with the measured temperature of the silicon ring 162 sensed by a temperature sensor 179 which may be a remote sensor such as an optical pyrometer or a fluoro-optical probe. The sensor 179 may extend partially into a very deep hole 162a in the ring 162, the deepness and narrowness of the hole tending at least partially to mask temperature-dependent variations in thermal emissivity of the silicon ring 162, so that it behaves more like a gray-body radiator for more reliable temperature measurement.

Figure 8B:
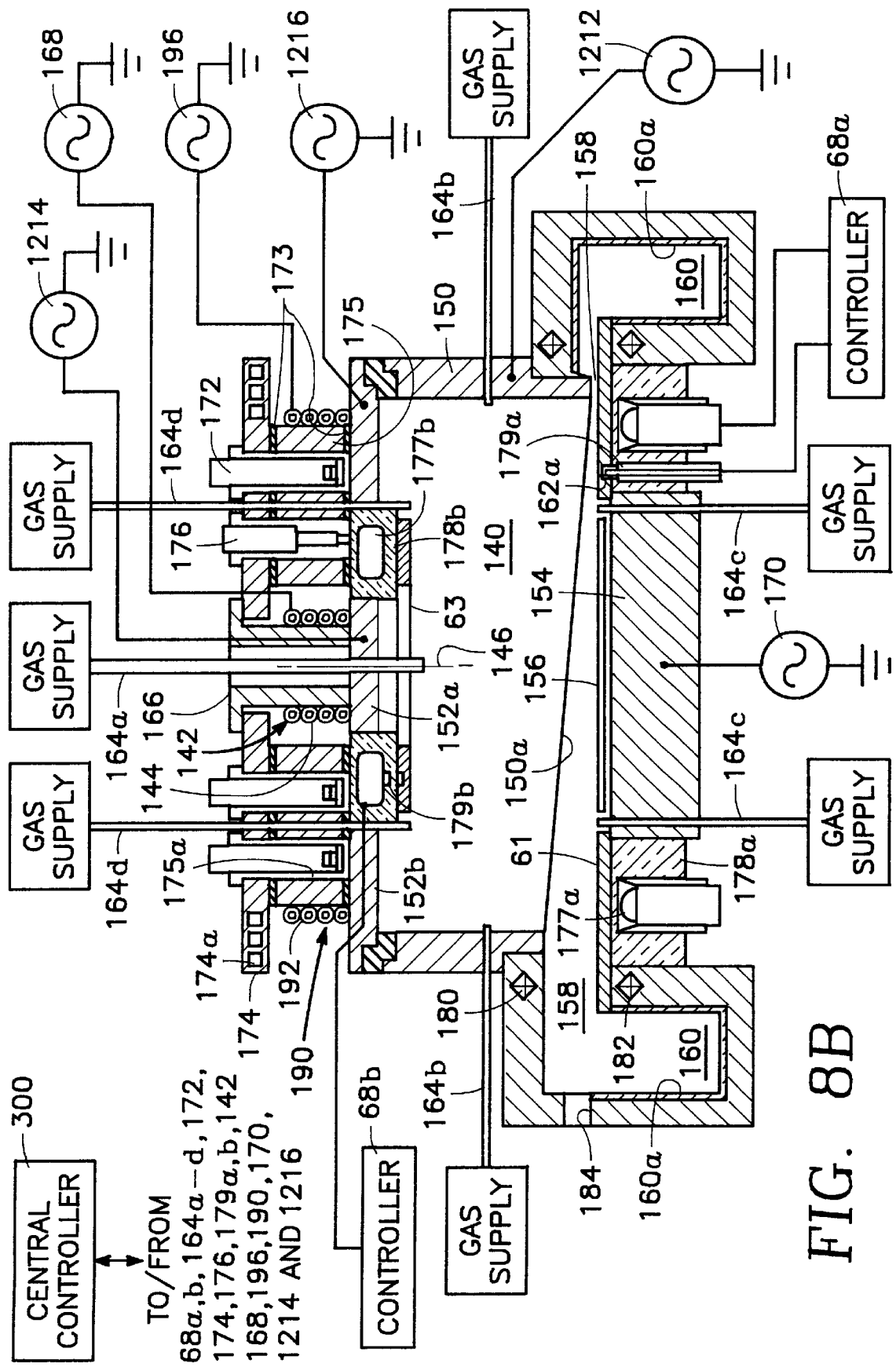
FIG. 8B corresponds to the embodiment of FIG. 8A in which the ceiling is divided into inner and outer portions.

FIG. 8B illustrates another variation in which the ceiling 152 itself may be divided into an inner disk 152a and an outer annulus 152b electrically insulated from one another and separately biased by independent RF power sources 1214, 1216 which may be separate outputs of a single differentially controlled RF power source.

In accordance with an alternative embodiment, a user-accessible central controller 1300 shown in FIGS. 8A and 8B, such as a programmable electronic controller including, for example, a conventional microprocessor and memory, is connected to simultaneously control gas flow rates through the central and peripheral gas feeds 164a, 164, RF plasma source power levels applied to the inner and outer antennas 142, 190 and RF bias power levels applied to the ceiling 152 and side wall 150 respectively (in FIG. 8A) and the RF bias power levels applied to the inner and outer ceiling portions 152a, 152b (in FIG. 8B), temperature of the ceiling 152 and the temperature of the silicon ring 162. A ceiling temperature controller 1218 governs the power applied by a lamp power source 1220 to the heater lamps 172 by comparing the temperature measured by the ceiling temperature sensor 176 with a desired temperature known to the controller 1300. The master controller 1300 governs the desired temperatures of the temperature controllers 1218 and 68a, 68b, the RF power levels of the solenoid power sources 168, 196, the RF power levels of the bias power sources 1210, 1212 (FIG. 8A) or 1214, 1216 (FIG. 8B), the wafer bias level applied by the RF power source 170 and the gas flow rates supplied by the various gas supplies (or separate valves) to the gas inlets 164a–d. The key to controlling the wafer bias level is the RF potential difference between the wafer pedestal 154 and the ceiling 152. Thus, either the pedestal RF power source 170 or the ceiling RF power source 1212 may be simply a short to RF ground. With such a programmable integrated controller, the user can easily optimize apportionment of RF source power, RF bias power and gas flow rate between the workpiece center and periphery to achieve the greatest center-to-edge process uniformity across the surface of the workpiece (e.g., uniform radial distribution of etch rate and etch selectivity). Also, by adjusting (through the controller 1300) the RF power applied to the solenoids 142, 190 relative to the RF power difference between the pedestal 154 and ceiling 152, the user can operate the reactor in a predominantly inductively coupled mode or in a predominantly capacitively coupled mode.

While the various power sources connected in FIG. 8A to the solenoids 142, 190, the ceiling 152, side wall 150 (or the inner and outer ceiling portions 152a, 152b as in FIG. 8B) have been described as operating at RF frequencies, the invention is not restricted to any particular range of frequencies, and frequencies other than RF may be selected by the skilled worker in carrying out the invention.

In a preferred embodiment of the invention, the high thermal conductivity spacer 175, the ceiling 152 and the side wall 150 are integrally formed together from a single piece of crystalline silicon.

While the expendable polymer-hardening precursor piece has been described as a planar ring 60 in the wafer support pedestal top surface plane, it may be of any shape and at any location, provided that it is not too distant from the heat source to be efficiently heated thereby and provided that it shields the plasma processing region of the chamber from the heat source (so as to avoid diversion of power from the heat source to plasma generation in the chamber). In the preferred embodiment some shielding of the plasma from energy of the heat source (in addition to that provided by the silicon ring 60 itself) is provided by a pair of ring magnets 100, 102 that prevent plasma flow between the plasma processing region of the chamber and the pumping annulus.

Figure 9:
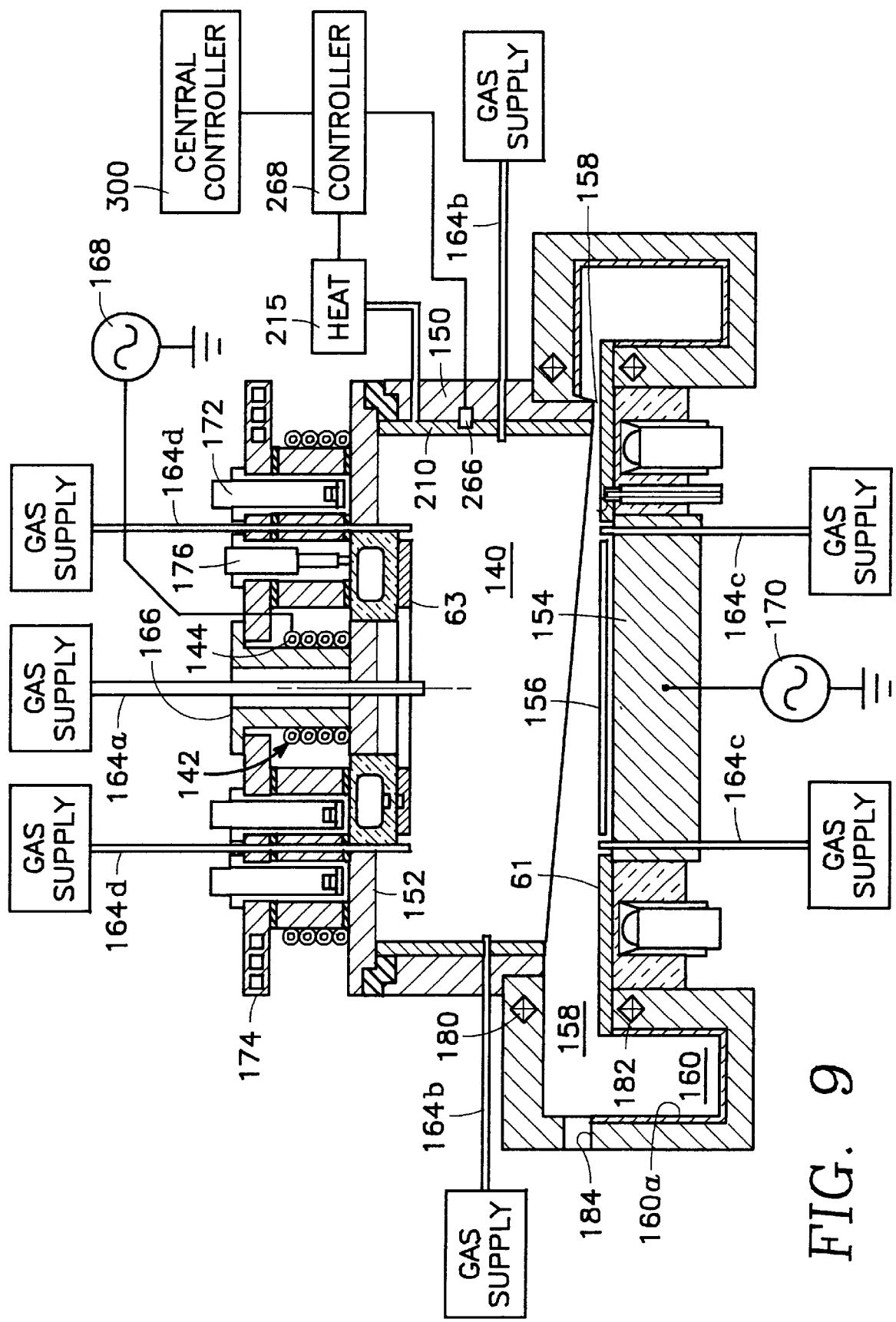
FIG. 9 illustrates an embodiment of the invention in which the expendable polymer-hardening precursor piece is a removable liner abutting the cylindrical chamber side wall.

Another embodiment that provides the requisite shielding and close proximity of the expendable polymer-hardening precursor piece to a remote heat source is illustrated in FIG. 9 in which the expendable piece is a cylindrical silicon liner 110 abutting the cylindrical chamber side wall interior surface. A peripheral heat source 115 adjacent the outside of the cylindrical side wall heats the silicon liner 110 through the side wall. The peripheral heat source 115 may be an induction heater, in which case the cylindrical chamber wall is either an insulator such as quartz or is a semiconductor such as silicon of sufficiently high resistivity to minimize absorption and maximize transmission of the induction field of the heat source 115 to the liner 110. Alternatively, the peripheral heat source 115 is a radiant heater such as a tungsten halogen lamp or an electric discharge lamp. A temperature sensor 166 and temperature controller 168 governing operation of the peripheral heater 115 perform temperature control in the manner of the sensor 66 and controller 68 of the embodiment of FIG. 8A. In the embodiment of FIG. 9, the master controller 300 governs the temperature controller 168.

Figure 10:
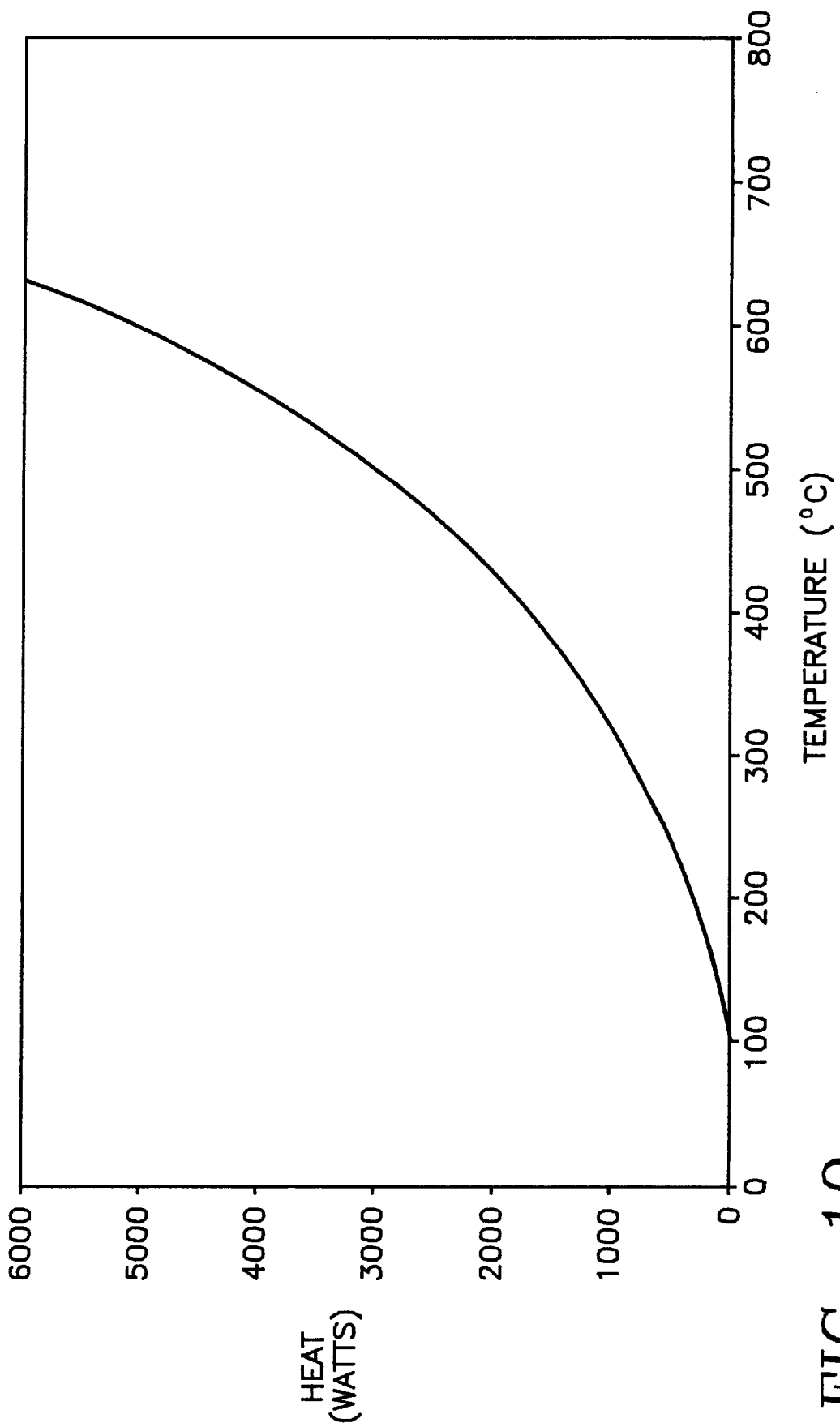
FIG. 10 is a graph illustrating the performance of a working example of a temperature control system in a reactor embodying the invention.
Figure 11:
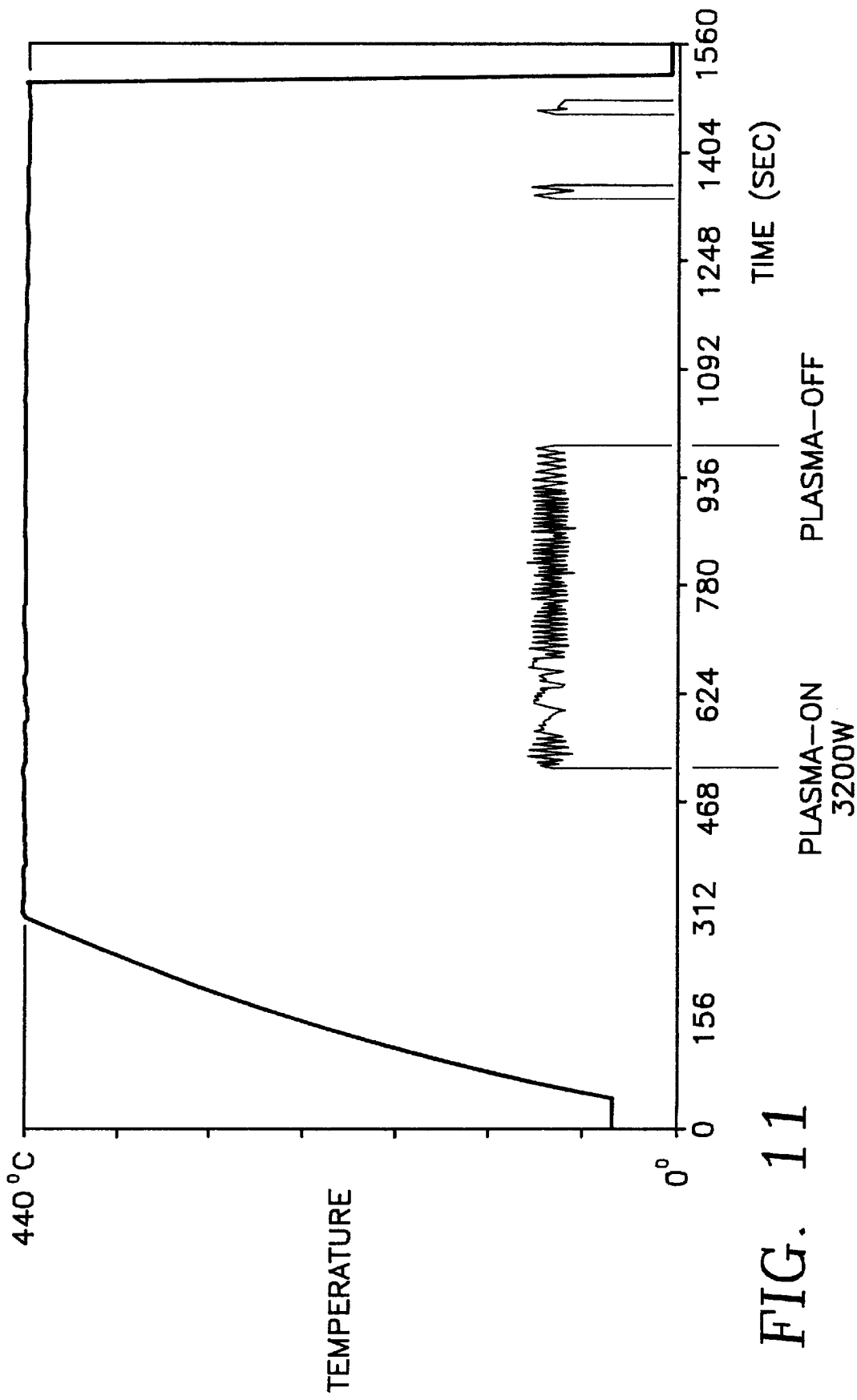
FIG. 11 is a graph illustrating the closed loop response of the temperature system whose performance is depicted in FIG. 10.
Figure 12:
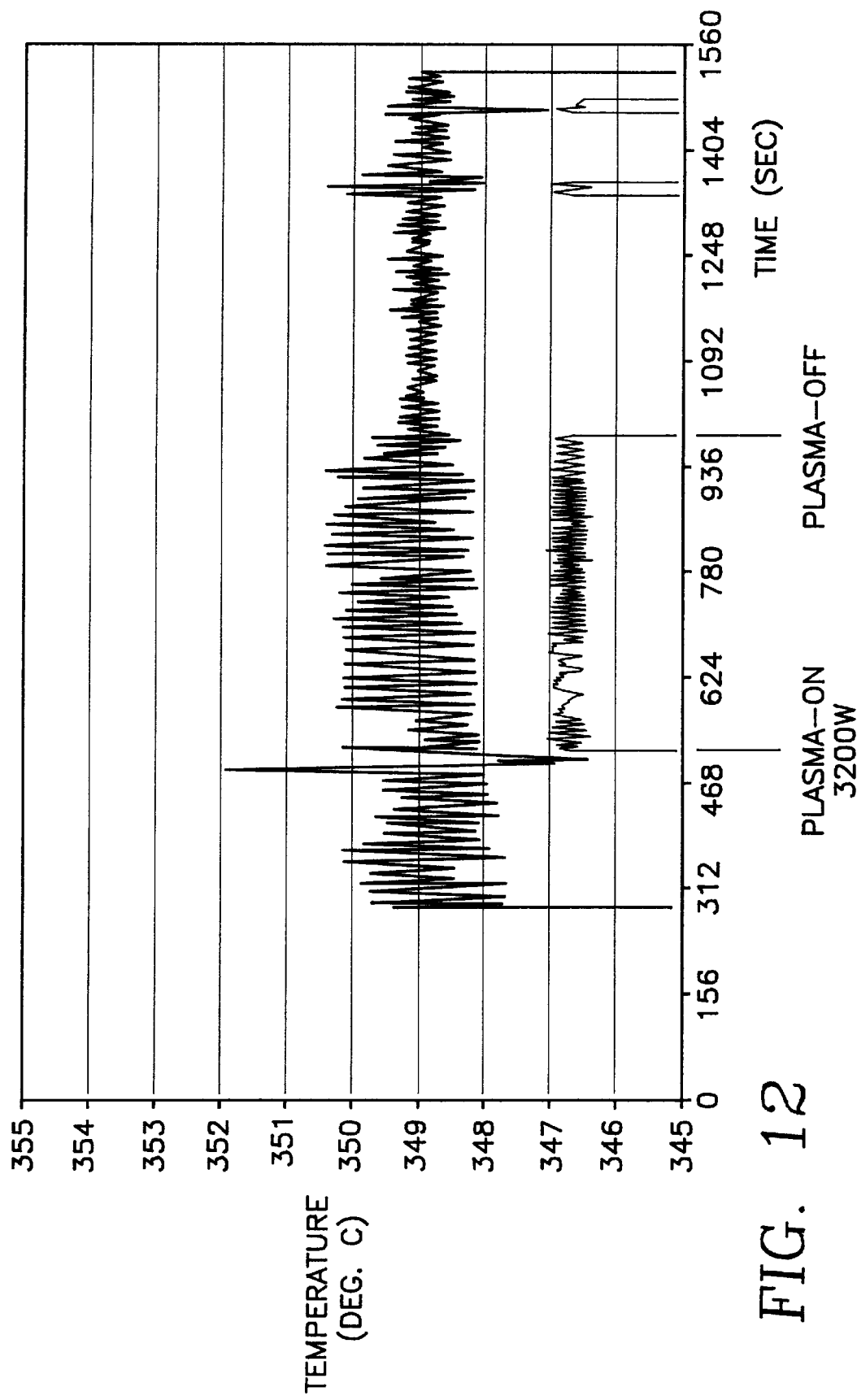
FIG. 12 is an enlarged view of a portion of the graph of FIG. 11.

The graph of FIG. 10 illustrates the performance of a temperature control system implemented in the embodiment of FIG. 6. The horizontal axis is the steady state temperature in degrees Celsius at which the temperature controller 68 has been commanded to hold the silicon ring 60, while the vertical axis is the applied power in Watts required to maintain the selected ring temperature. The graph of FIG. 11 illustrates the closed loop temperature response of the system of FIG. 6, the horizontal axis being time in seconds and the vertical axis being the ring temperature in degrees Celsius. In the graph of FIG. 11, the ring 60 begins at an initial temperature near room temperature and, after about 30 seconds, the controller 68 is commanded to put the ring temperature at 440° C. This temperature is reached at about 310 seconds with no overshoot and only a trace amount of system noise. At about 550 seconds a plasma is ignited in the chamber and is extinguished at about 1000 seconds, the effect on the ring temperature being almost unobservable in FIG. 11. This latter event proves the stability of the temperature control system and its responsiveness. FIG. 12 is a greatly enlarged view of a portion of the graph of FIG. 11 in the neighborhood of the time window from 301 seconds (when the target temperature is reached with no overshoot) and including 550 seconds (when the plasma is temporarily turned on). The plasma was ignited with 3.2 kWatts of source power at 550 seconds and the enlarged view of FIG. 12 reveals a short spike in the ring temperature coincident with that event. This data was obtained using the fluoro-optical probe version of the sensor 66 and the optical fiber 72.

In lieu of heating the polymer hardening precursor piece (e.g., the silicon ring 60), RF bias power may be applied from a source 400 (indicated in dashed line in FIG. 7) to the piece to achieve a desired effect in increasing polymer resistance to etching. The skilled worker can readily ascertain the requisite RF bias power level for this application by increasing the RF bias power on the piece (e.g., the silicon ring 60) until polymer deposition no longer accumulates thereon and the surface of the piece remains free for interaction with the plasma. While this may be practiced as an alternative mode of the invention, it is not the most preferable mode because: (a) the consumption of the polymer hardening precursor piece will be higher, and (b) some electrical (RF) coupling to the polymer hardening precursor piece must be provided to impose the requisite RF bias power on it, complicating its structure. In yet another alternative mode, heating and RF biasing of the polymer hardening precursor piece may be combined.

Figure 13:
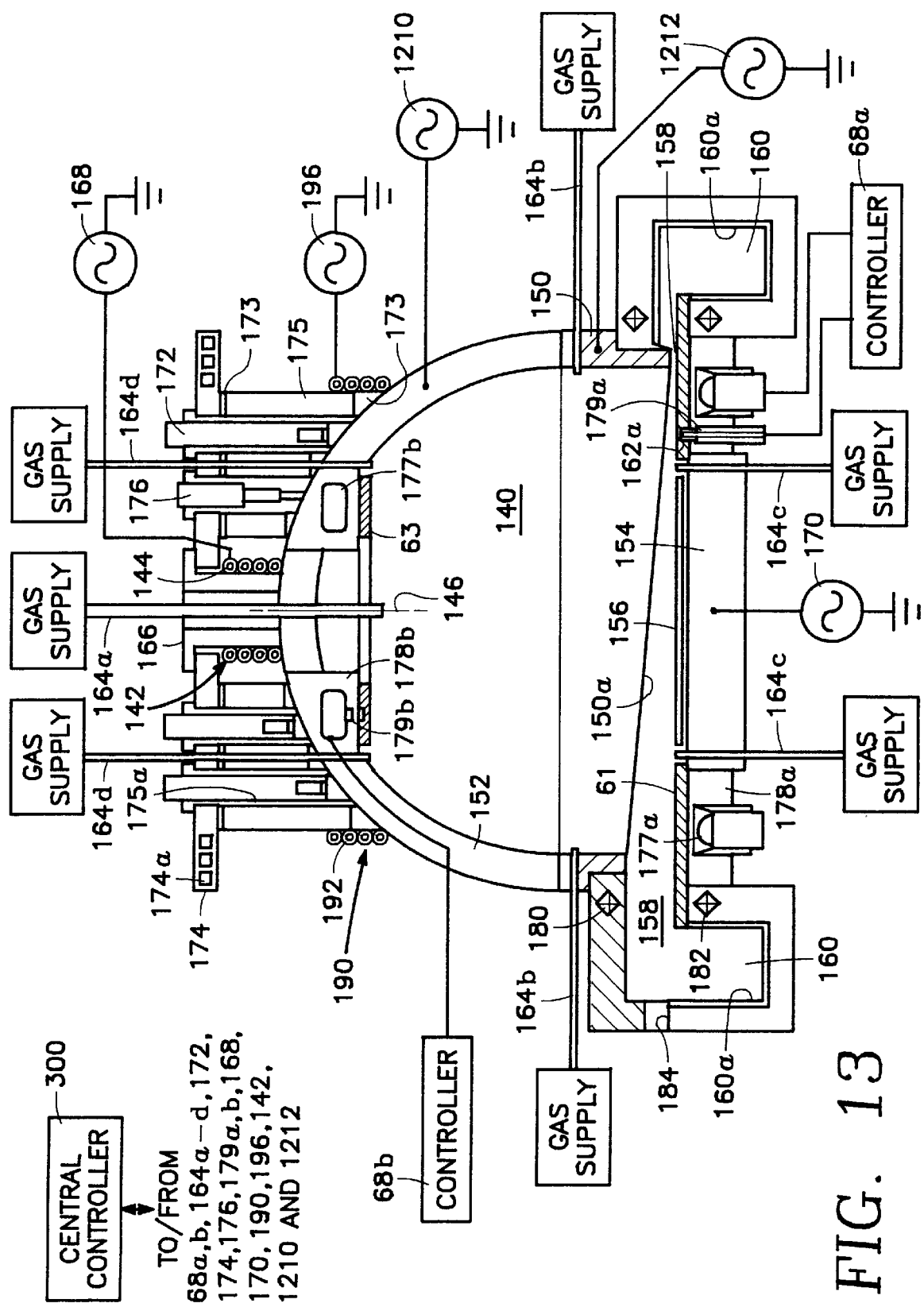
FIG. 13 illustrates an embodiment corresponding to FIG. 8A but having a dome-shaped ceiling.
Figure 14:
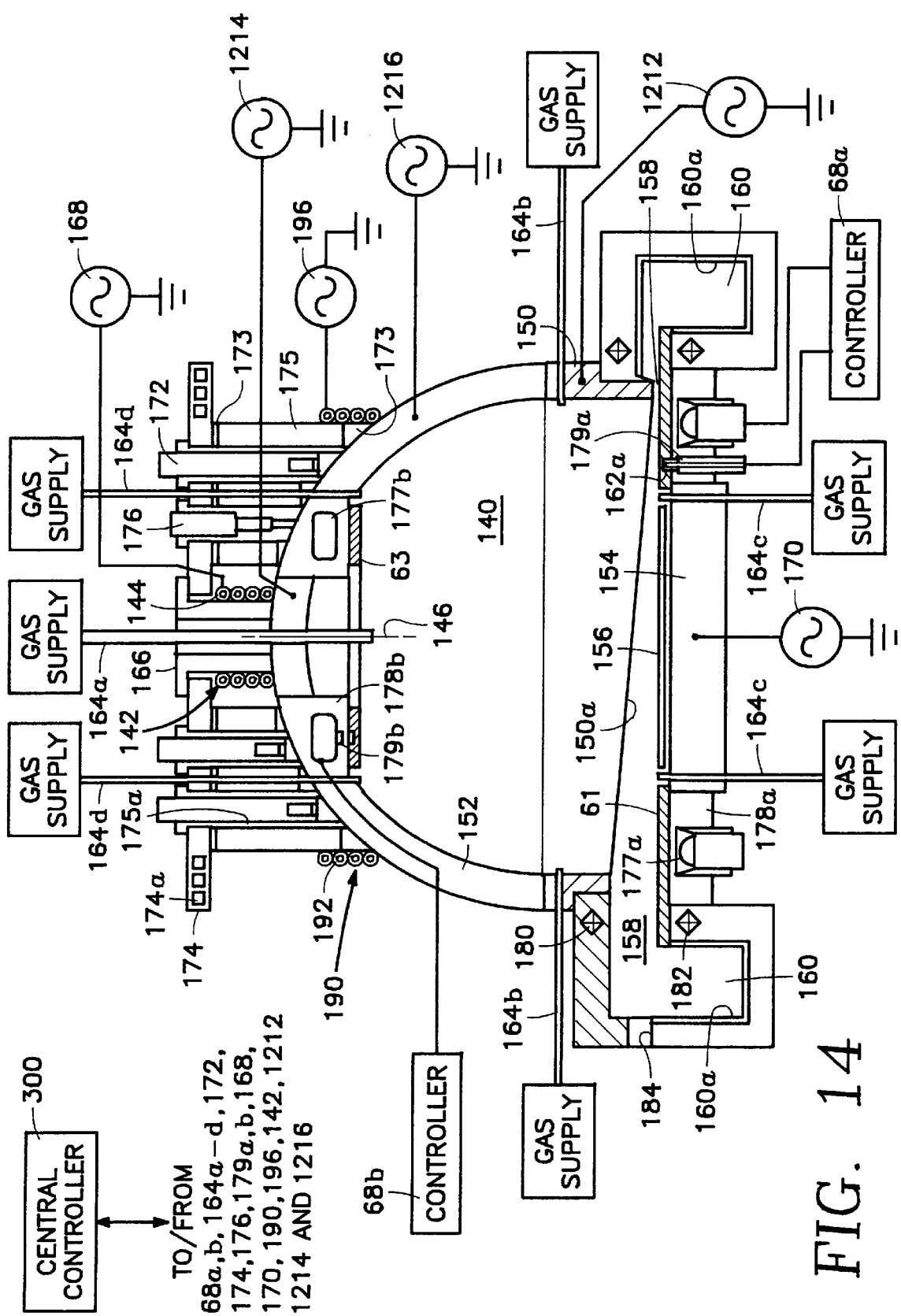
FIG. 14 illustrates an embodiment corresponding to FIG. 8B but having a dome-shaped ceiling.
Figure 15:
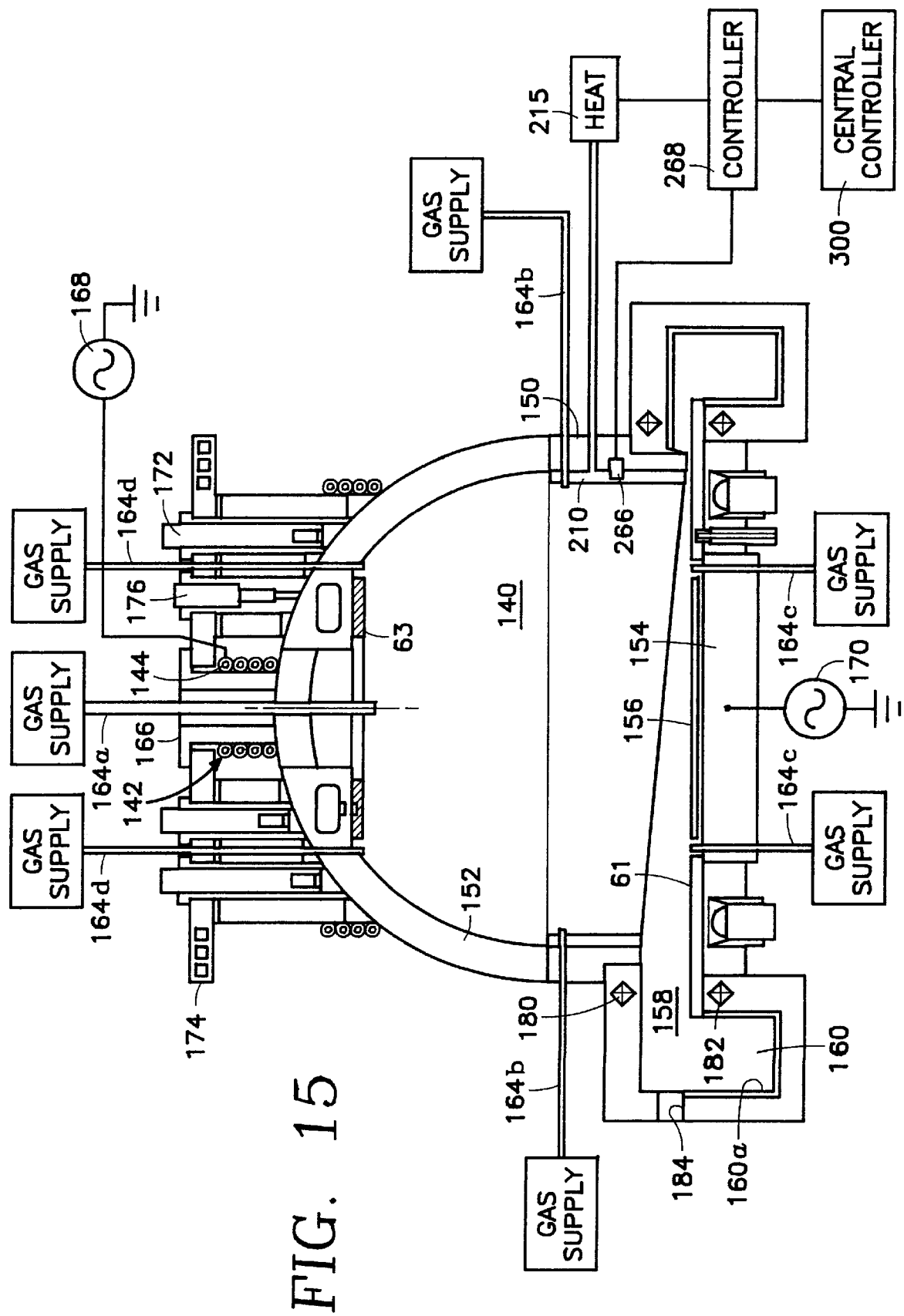
FIG. 15 illustrates an embodiment corresponding to FIG. 9 but having a dome-shaped ceiling.

FIG. 13 illustrates how the embodiment of FIG. 8A may be modified to provide it with a dome-shaped monolithic ceiling. In particular, the ceiling 152, which may have a multiradius dome shape, is hemispherical in the illustrated embodiment. FIG. 14 illustrates an embodiment corresponding to FIG. 8B in that the dome-shaped ceiling 152 is divided into plural disk and annular sections 152a, 152b which are electrically separate and may be connected to separate RF power sources. FIG. 15 illustrates an embodiment corresponding to FIG. 9 in that the dome-shaped ceiling is combined with the feature of an expendable polymer-hardening precursor piece in the form of a vertical cylindrical liner 210 adjacent the vertical cylindrical chamber side wall. In order to maintain the polymer-hardening precursor liner at the requisite temperature, a heater 215 (such as an electric heater) provides heat to the liner 210. A temperature sensor 266 monitors the temperature of the liner 210. The output of the sensor 266 is connected to a controller 268 governing electric current supplied to the heater 215. The controller 268 is of the conventional type which can be programmed with a selected temperature. The controller 268 increases or decreases the electric current supplied to the heater 215 depending upon whether the sensor 266 senses a liner temperature which is below or above the selected temperature, respectively.

In accordance with the methodology of the invention, process uniformity across the wafer surface is optimized by adjusting the radial density distribution across the wafer surface of either or both etchant precursor species and deposition precursor species in the plasma. This is accomplished in the invention by any one or some or all of several methods. A first method is to divide the ceiling 152 into plural radially disposed separate sections (as illustrated in FIG. 8B for example) and changing the RF power applied to one section relative to the other. A second method is to change the radial distribution of temperature across the ceiling. As discussed above, this can be accomplished by separately controlling the heaters 172 disposed at different radial locations. A third method is to separately adjust the process gas flow rate in the radially inner and outer gas flow inlets 164a, 164b, 164d.

Figure 16:
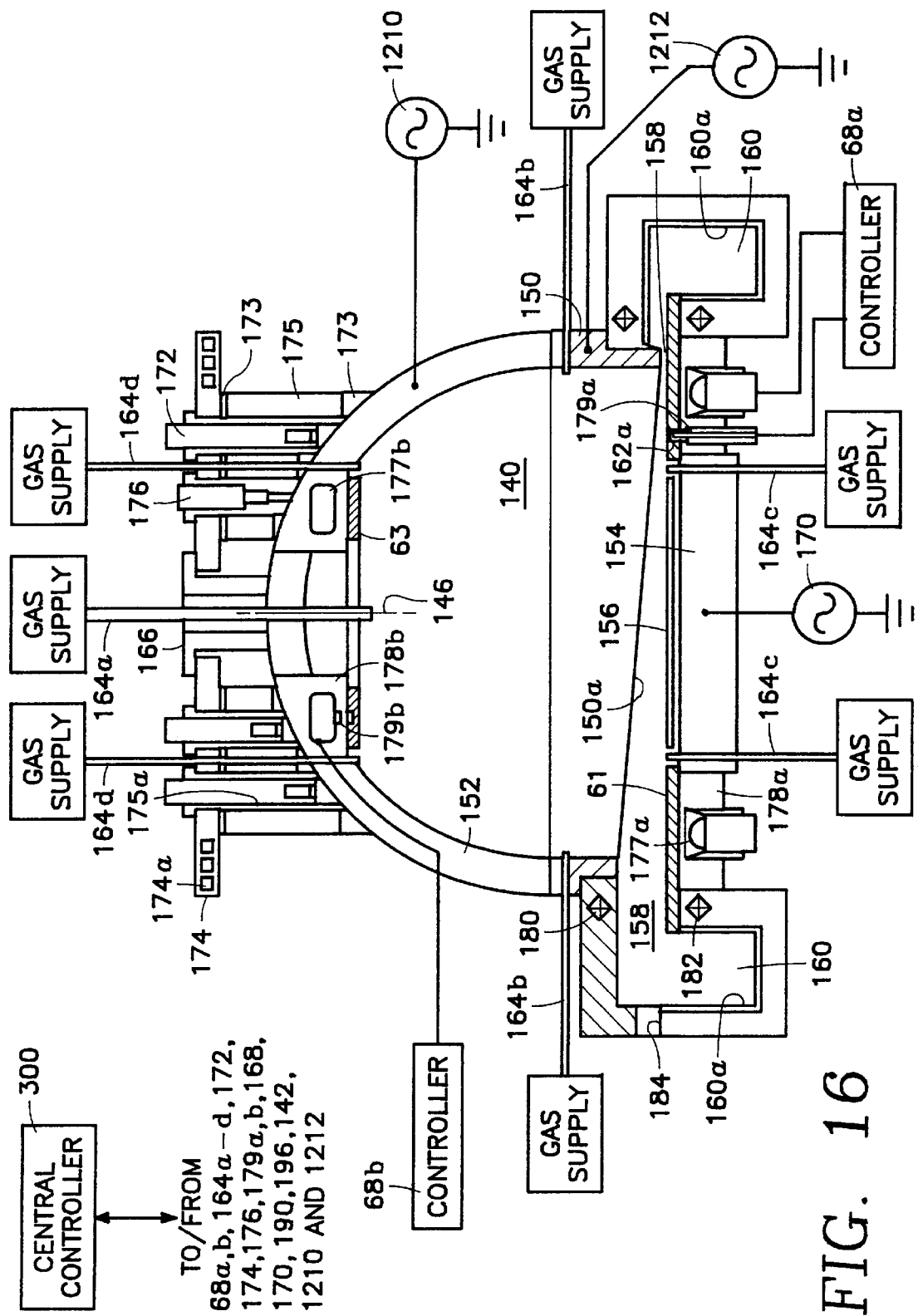
FIG. 16 illustrates an embodiment corresponding to FIG. 8A in which plasma source power is capacitively coupled rather than inductively coupled.
Figure 17:
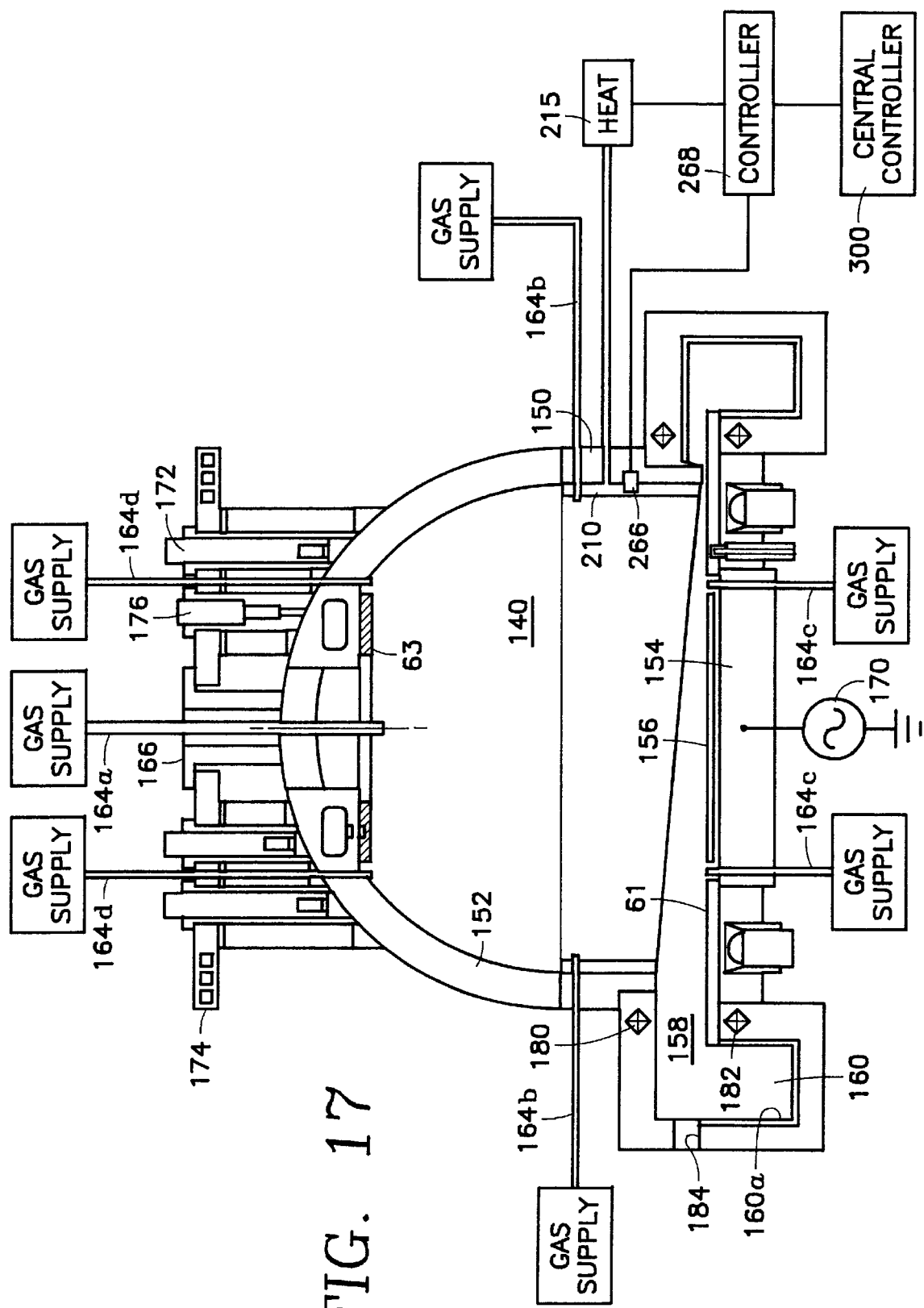
FIG. 17 illustrates an embodiment corresponding to FIG. 9 in which plasma source power is capacitively coupled rather than inductively coupled.

While the expendable temperature-regulated polymer-hardening precursor piece has been disclosed in combination with an inductively coupled plasma reactor, other applications are useful. For example, the polymer-hardening precursor piece may be used in a capacitively coupled plasma reactor. Such an application is illustrated in FIG. 16. In FIG. 16 the ceiling 152 is driven by the RF power source 1210 to provide plasma source power into the chamber. No inductive antenna is necessary (e.g., the solenoid antennas 142, 190) although an inductive antenna may be present even through the reactor is operated in a predominantly capacitive coupling mode. If there is no inductive antenna over the ceiling 152, then it is not absolutely required for the ceiling to be a semiconductor material although such a feature is advantageous in any case for the reasons described previously herein. If indeed the ceiling is not a semiconductor, the heaters 172 and the associated control apparatus may be eliminated if desired. In the capacitive coupling mode, the plasma source power is applied predominantly between the ceiling 152 and the wafer pedestal 154, so that one of the two RF power sources 1210 and 170 may be eliminated as redundant. (In the inductive coupling mode, having two separate sources 1210, 170 is not necessarily redundant since the source 170 provides independent RF bias controlling ion energy near the wafer while the source 1210 controls the bombardment or activation of the ceiling 152). FIG. 17 illustrates how the feature of an expendable polymer-hardening precursor piece in the form of a vertical cylindrical liner 210 on the chamber side wall interior may be combined with a capacitively coupled plasma reactor.

Figure 18:
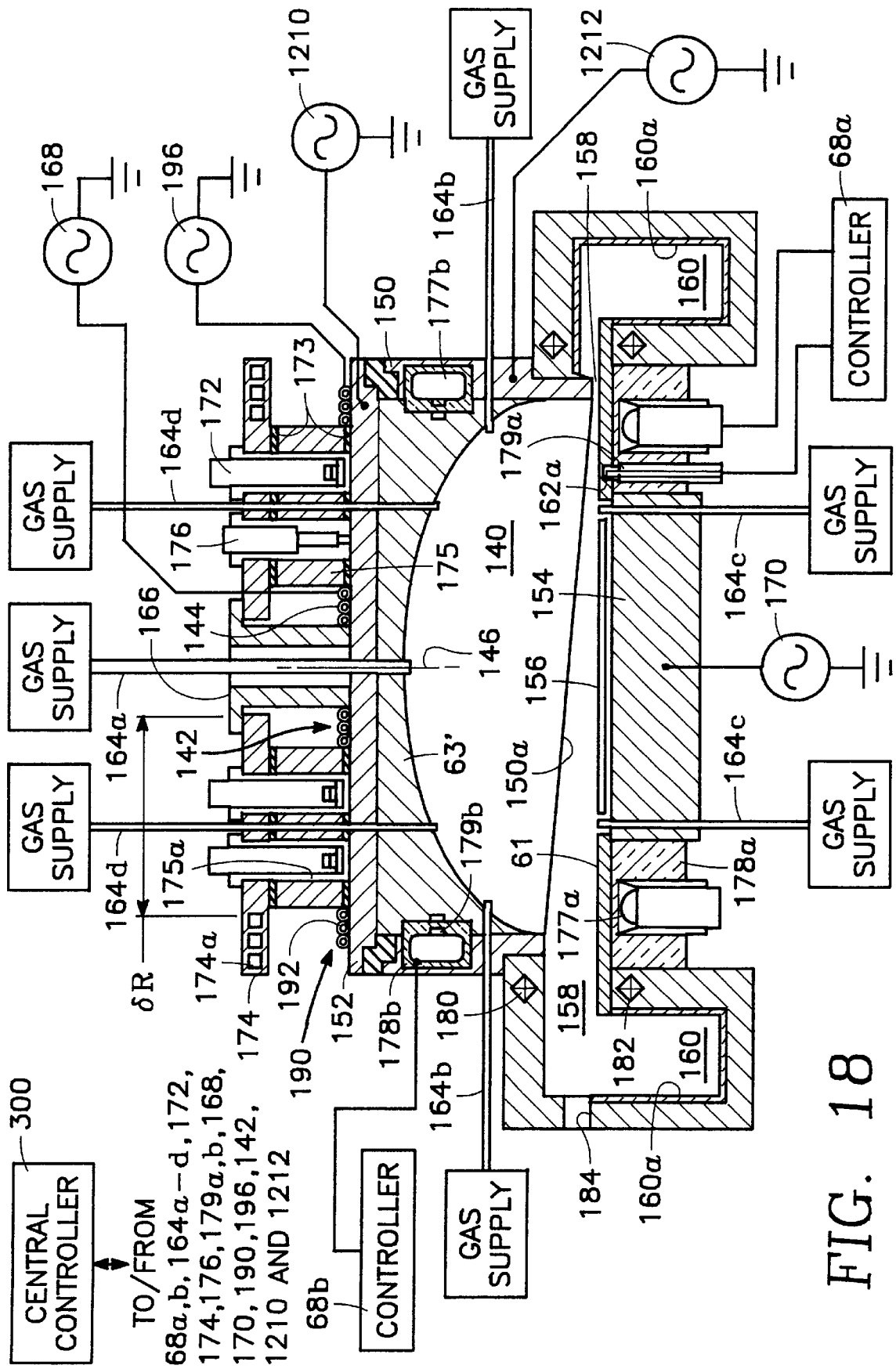
FIG. 18 illustrates a modification of the embodiment of FIG. 8A in which the polymer-hardening precursor ring is replaced by a polymer-hardening precursor chamber liner over the chamber ceiling.
Figure 19:
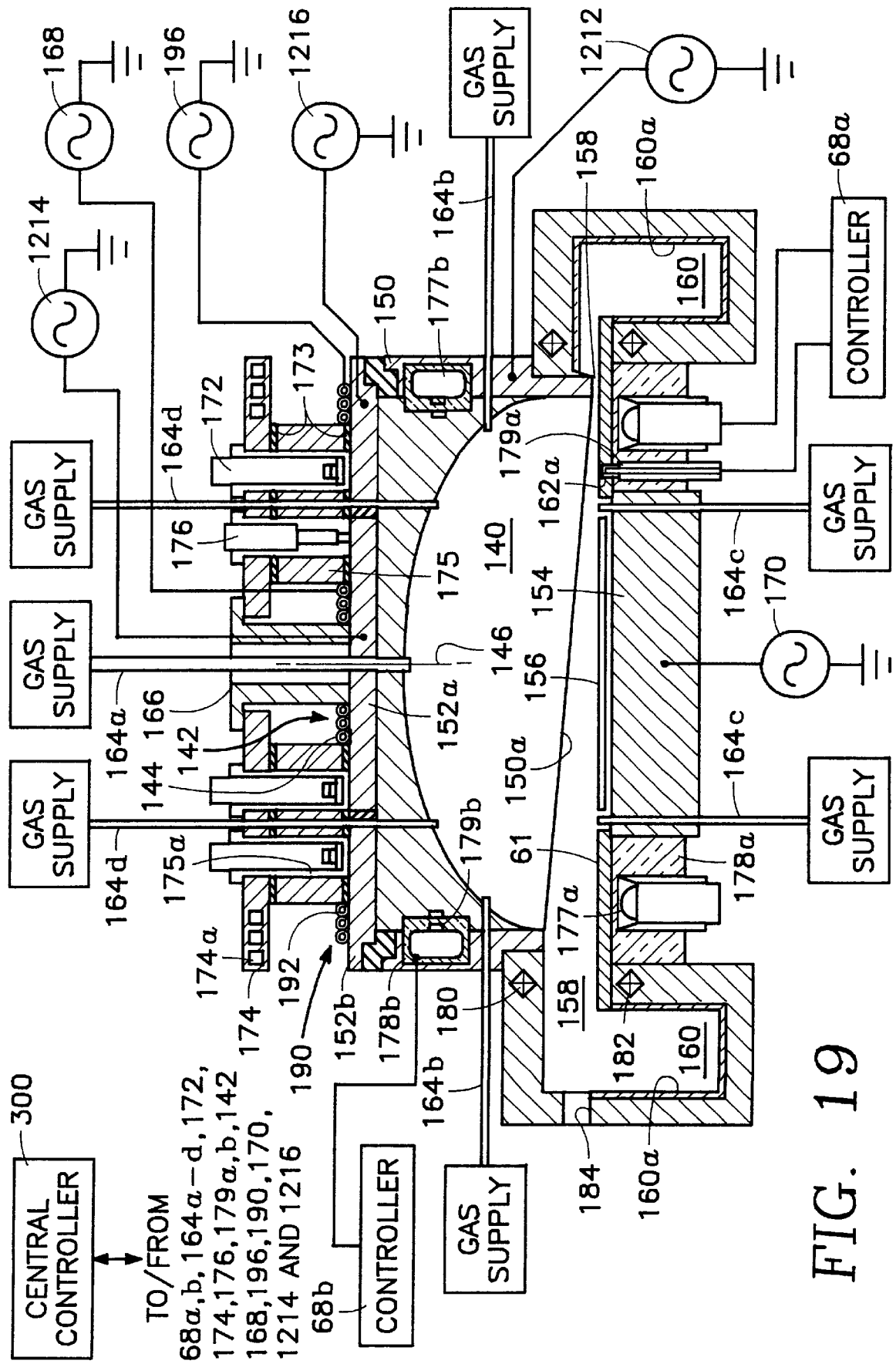
FIG. 19 illustrates a modification of the embodiment of FIG. 18 adopting the feature of FIG. 8B in which the ceiling is divided into radially inner and outer (disk and annular) portions.

FIG. 18 illustrates how the plasma reactor of FIG. 8A may be modified so that the polymer-hardening precursor ring 63 is replaced by a polymer-hardening precursor chamber liner 63' near chamber ceiling. In this embodiment, the liner 63' has an outer surface 63'*a* that fits the square corner between the flat ceiling 152 and the cylindrical sidewall 150 and an inner surface 63'*b* which is three-dimensionally shaped and confines the plasma processing region to the three-dimensional shape. In the embodiment of FIG. 18, the liner interior surface 63'*b* forms at least a portion of the ceiling of the chamber confining the plasma to a volume whose top has the three dimensional (e.g., dome) shape. In the drawing of FIG. 18, this three-dimensional shape is a multi-radius dome shape having a radius of curvature which increases from a minimum radius value at the circumferential periphery of the liner 63' to a maximum radius value at the center. However, the shape may be a single-radius shape or a hemispherical shape. FIG. 19 illustrates how the embodiment of FIG. 18 may be modified to adopt the feature of FIG. 8B in which the ceiling 152 is divided into radially inner and outer (disk and annular) portions 152*a*, 152*b* which are driven with independent RF power levels and/or RF frequencies.

Figure 20:
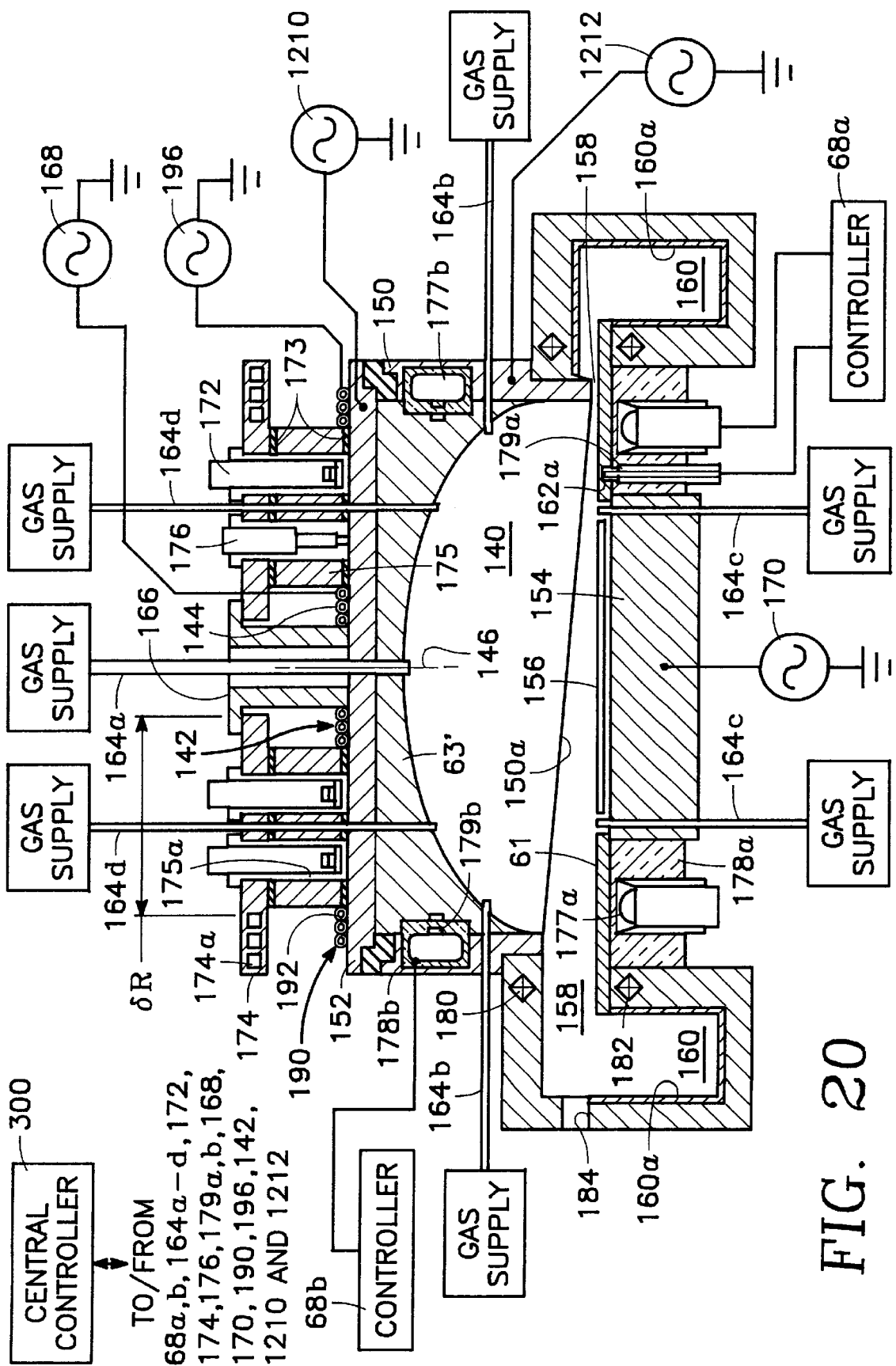
FIG. 20 illustrates a modification of the embodiment of FIG. 18 replacing the solenoid antenna coils with the flat antenna coils of the embodiment of FIG. 3.
Figure 21:
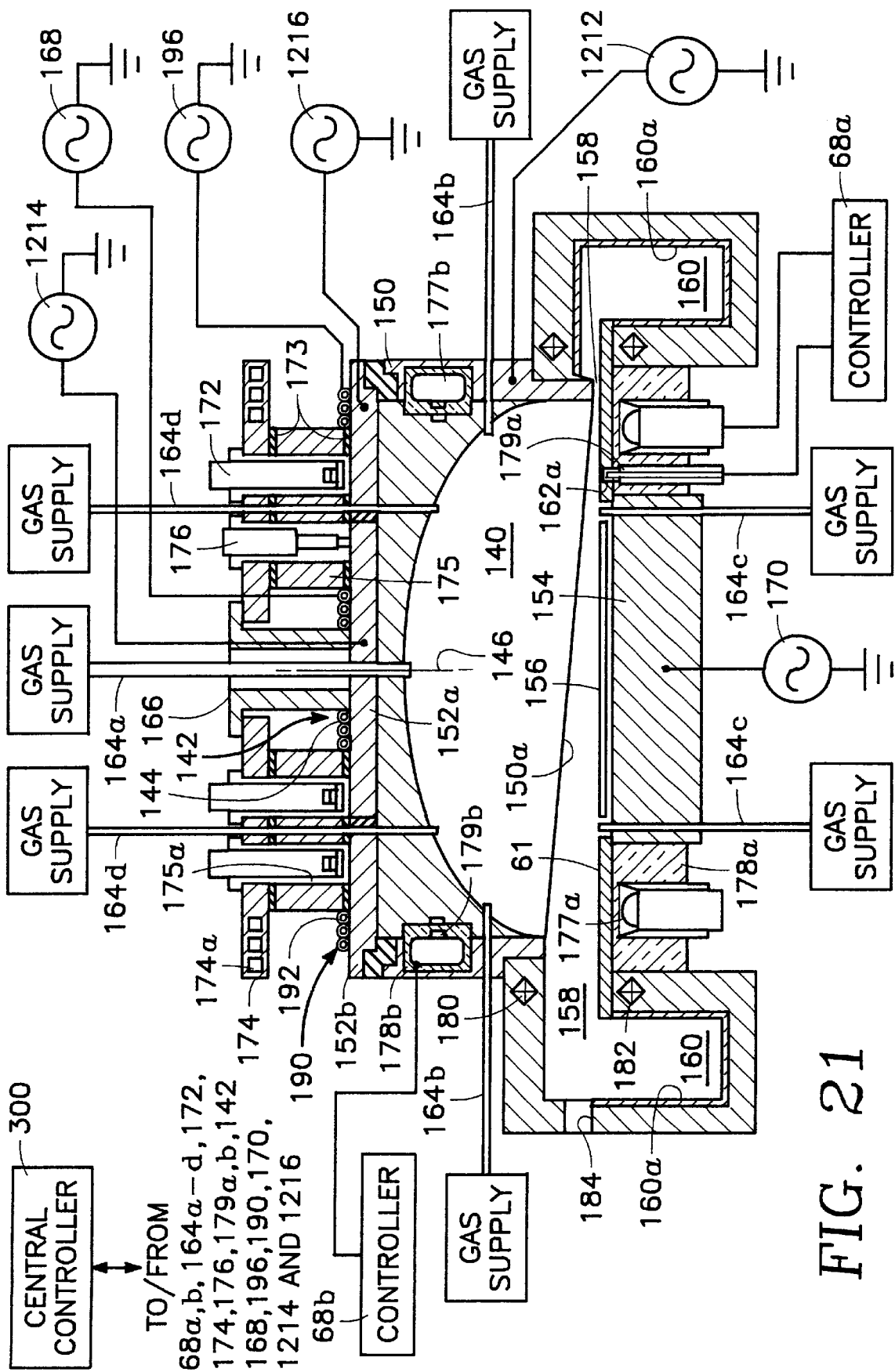
FIG. 21 illustrates a modification of the embodiment of FIG. 20 adopting the feature of FIG. 8B in which the ceiling is divided into radially inner and outer (disk and annular) portions.

FIG. 20 illustrates how the embodiment of FIG. 18 may be modified to replace the solenoid antenna coils 142, 190 with the flat antenna coils 50*a*, 50*b* of the embodiment of FIG. 3. FIG. 21 illustrates how the embodiment of FIG. 20 may be modified to adopt the feature of FIG. 8B in which the ceiling 152 is divided into radially inner and outer (disk and annular) portions 152*a*, 152*b* which are driven with independent RF power levels and/or RF frequencies.

In the embodiments of FIGS. 20 and 21, the heating and cooling apparatus is distributed across a large proportion of the top surface of the ceiling, so that only a relatively small number of windings are accommodated in the flat coils 50*a*, 50*b*. In order to increase the number of flat coil windings, a simpler heating and cooling apparatus may be employed in the manner of FIG. 3, in order to accommodate a greater number of flat coil windings.

In each of the embodiments disclosed in this specification in which the ceiling 152 is driven with RF power, the RF plasma source power has been described as being inductively coupled by an inductor or inductors, such as the inner and outer solenoid antennas 142, 190. However, RF plasma source power may instead be capacitively coupled from the ceiling 152 (or ceiling portions 152*a*, 152*b*) applying sufficient RF power to the ceiling 152 with the wafer support or pedestal 154 being connected as an RF return path for the power applied to the ceiling 152, while very little or no RF power is applied to the inductors 142, 190 or such inductors are eliminated.

While the invention has been described in detail by specific reference to preferred embodiments thereof, it is understood that variations and modifications thereof may be made without departing from the true spirit and scope of the invention.

What is claimed is:

1. A plasma etch process comprising:
   providing a chamber within which to carry out said process;
   supporting an article to be processed on a support in the chamber;
   supplying a process gas containing at least etchant and polymer precursor materials;
   providing, in addition to said process gas, a source material of silicon or carbon in said chamber;
   generating a plasma within said chamber;
   heating said source material sufficiently to at least maintain a surface of said source reactive with said plasma; and
   adjusting the radial distribution of plasma ion density across said article to be processed.

2. The process of claim 1, wherein the generating of a plasma comprises applying RF plasma source power into said chamber and wherein said adjusting comprises adjusting the radial RF power distribution in said chamber.

3. The process of claim 2 wherein said reactor comprises an inductive antenna for the applying of RF plasma source power, said antenna being divided into concentric electrically separate antenna sections, and the adjusting of radial RF power distribution in said chamber comprises adjusting separate RF power levels applied to said separate antenna sections.

4. The process of claim 1 wherein the adjusting of radial distribution of plasma ion density comprises adjusting radial distribution of process gas in said chamber.

5. The process of claim 4 wherein said reactor comprises plural process gas inlets disposed at different radial locations for the supplying of process gas, and wherein said adjusting of radial distribution of process gas in said chamber comprises adjusting different gas flow rates to respective ones of said gas inlets at different radial locations.

6. The process of claim 1 wherein said chamber comprises a semiconductor ceiling facing said support and wherein the adjusting of radial distribution of plasma ion density comprises adjusting temperatures of different radial zones of said ceiling.

7. The process of claim 1 wherein said chamber comprises a ceiling facing said support and said ceiling comprises plural electrically separate concentric ceiling sections, and the adjusting of radial distribution of plasma ion density comprises adjusting different RF power levels applied to respective ones of said plural concentric sections of said ceiling.

8. The process of claim 1 wherein said chamber comprises plural electrically separate concentric chamber enclosure sections, and the adjusting of radial distribution of plasma ion density comprises adjusting different RF power levels applied to respective ones of said plural concentric enclosure sections.

9. The process of claim 1 wherein the step of heating comprises heating said source material to at least a polymer condensation temperature.

10. The process of claim 9 wherein said etch process etches first and second different materials on said article at first and second etch rates respectively, said first etch rate being greater than said second etch rate corresponding to an etch selectivity of said first material to said second material which is a function of said first and second etch rates, and wherein said heating step further comprises:
   increasing a temperature of said source material into a temperature range above said polymer condensation temperature to increase said etch selectivity.

11. The process of claim 10 wherein said first material overlies said second material and said etchant creates openings through said first material to a expose portions of said second material.

12. The process of claim 11 wherein:
said polymer precursor material provides material for polymer deposition on the exposed portions of said second material;
said etchant precursor material provides material for etching said article; and
said polymer deposition reduces etching of said second material to enhance etch selectivity.

13. The process of claim 12 wherein:
a photoresist mask layer over said first material has openings therethrough defining said openings; and
said polymer deposition reduces etching of said second material and of said photoresist material to enhance etch selectivity.

14. The process of claim 12 wherein said first material comprises an oxygen-containing material and said second material comprises a non-oxygen containing material.

15. The process of claim 10 wherein said heating step further comprises:
increasing a temperature of said source material into a temperature range above said polymer condensation temperature.

16. The process of claim 15 wherein said temperature range is one wherein polymer formed on said wafer contains an amount of said source material.

17. The process of claim 11 wherein said first material comprises an oxide, said second material comprises silicon or polysilicon, an etchant precursor of said process gas comprises fluorine, an polymer precursor of said process gas comprises at least fluorine and carbon and said source material comprises silicon.

18. The process of claim 11 wherein said temperature range lies above about 100° C.

19. The process of claim 11 wherein said temperature range lies above about 220° C.

20. The process of claim 17 wherein said temperature range lies above about 100° C.

21. The process of claim 17 wherein said temperature range lies above about 220° C.

22. The process of claim 1 further comprising applying RF power to said source material.

23. The process of claim 22 wherein said RF power applied to said source material and said heating of said source material together are sufficient to maintain said surface thereof reactive with said plasma.

24. The process of claim 23 wherein said source material comprises a scavenger for an etchant derived from said etchant precursor, and wherein said RF power applied to said source material is sufficient to promote significant scavenging of said etchant.

25. The process of claim 24 further comprising applying RF power to said source material at an RF power level substantially reduced from a reference power level at which said source material when near said polymer condensation temperature provides a significant amount of fluorine scavenger material into said plasma, while increasing the temperature of said source material to compensate for the reduction in RF power.

26. The process of claim 25 wherein said RF power level is reduced by at least an integer number below said reference power level while said target temperature is only fractionally increased.

27. The process of claim 26 wherein said RF power level is reduced about four-fold and said target temperature is increased to about 240° C.

* * * * *